US011426900B2

(12) United States Patent
Chen et al.

(10) Patent No.: US 11,426,900 B2
(45) Date of Patent: Aug. 30, 2022

(54) MOLDING A FLUID FLOW STRUCTURE

(71) Applicant: HEWLETT-PACKARD DEVELOPMENT COMPANY, L.P., Houston, TX (US)

(72) Inventors: Chien-Hua Chen, Corvallis, OR (US); Michael W. Cumbie, Albany, OR (US); Arun K. Agarwal, Corvallis, OR (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 1793 days.

(21) Appl. No.: 14/770,198

(22) PCT Filed: Mar. 20, 2013

(86) PCT No.: PCT/US2013/033046
§ 371 (c)(1),
(2) Date: Aug. 25, 2015

(87) PCT Pub. No.: WO2014/133561
PCT Pub. Date: Sep. 4, 2014

(65) Prior Publication Data
US 2016/0001465 A1 Jan. 7, 2016

(30) Foreign Application Priority Data

Feb. 28, 2013 (WO) ................ PCT/US2013/028207
Feb. 28, 2013 (WO) ................ PCT/US2013/028216

(51) Int. Cl.
*B29C 33/00* (2006.01)
*B41J 2/16* (2006.01)
(Continued)

(52) U.S. Cl.
CPC .......... *B29C 33/0033* (2013.01); *B29C 39/02* (2013.01); *B29C 39/26* (2013.01);
(Continued)

(58) Field of Classification Search
None
See application file for complete search history.

(56) References Cited

U.S. PATENT DOCUMENTS 4,224,627 A 9/1980 Powell et al.
4,460,537 A * 7/1984 Heinle ................... B29C 45/02
257/E21.504
(Continued)

FOREIGN PATENT DOCUMENTS

CN 1175506 A 3/1998
CN 1286172 A 3/2001
(Continued)

OTHER PUBLICATIONS

Kumar, Aditya et al.; Wafer Level Embedding Technology for 3D Wafer Level Embedded Package; Institute of Microelectronics, A*Star; 2Kinergy Ltd, TECHplace II; 2009 Electronic Components and Technology Conference.
(Continued)

*Primary Examiner* — Mohammad M Ameen
(74) *Attorney, Agent, or Firm* — Fabian VanCott

(57) ABSTRACT

In one example, a process for making a micro device structure includes molding a micro device in a monolithic body of material and forming a fluid flow passage in the body through which fluid can pass directly to the micro device.

19 Claims, 19 Drawing Sheets

(51) Int. Cl.
  *B29C 39/02* (2006.01)
  *B29C 39/26* (2006.01)
  *B29C 39/36* (2006.01)
  *B29L 31/00* (2006.01)

(52) U.S. Cl.
  CPC ............. *B29C 39/36* (2013.01); *B41J 2/1601* (2013.01); *B41J 2/1607* (2013.01); *B41J 2/1623* (2013.01); *B41J 2/1628* (2013.01); *B41J 2/1637* (2013.01); *B29L 2031/767* (2013.01)

(56) References Cited

U.S. PATENT DOCUMENTS

| | | | |
|---|---|---|---|
| 4,521,788 A | 6/1985 | Kimura et al. |
| 4,633,274 A | 12/1986 | Matsuda |
| 4,873,622 A | 10/1989 | Komuro et al. |
| 4,881,318 A | 11/1989 | Komuro et al. |
| 4,973,622 A | 11/1990 | Baker et al. |
| 5,016,023 A | 5/1991 | Chan et al. |
| 5,160,945 A | 11/1992 | Drake |
| 5,387,314 A | 2/1995 | Baughman et al. |
| 5,565,900 A | 10/1996 | Cowger et al. |
| 5,696,544 A | 12/1997 | Komuro |
| 5,719,605 A | 2/1998 | Anderson et al. |
| 5,745,131 A | 4/1998 | Kneezel et al. |
| 5,841,452 A | 11/1998 | Silverbrook |
| 5,847,725 A | 12/1998 | Cleland et al. |
| 5,894,108 A * | 4/1999 | Mostafazadeh ....... H01L 21/568 174/529 |
| 6,022,482 A | 2/2000 | Chen et al. |
| 6,123,410 A | 9/2000 | Beerling et al. |
| 6,132,028 A | 10/2000 | Su et al. |
| 6,145,965 A | 11/2000 | Inada et al. |
| 6,179,410 B1 | 1/2001 | Kishima et al. |
| 6,188,414 B1 | 2/2001 | Wong et al. |
| 6,190,002 B1 | 2/2001 | Spivey |
| 6,227,651 B1 | 5/2001 | Watts et al. |
| 6,250,738 B1 | 6/2001 | Waller et al. |
| 6,254,819 B1 | 7/2001 | Chatterjee et al. |
| 6,281,914 B1 | 8/2001 | Hiwada et al. |
| 6,291,317 B1 | 9/2001 | Salatino et al. |
| 6,305,790 B1 | 10/2001 | Kawamura et al. |
| 6,341,845 B1 | 1/2002 | Scheffelin et al. |
| 6,379,988 B1 | 4/2002 | Peterson et al. |
| 6,402,301 B1 | 6/2002 | Powers et al. |
| 6,454,955 B1 | 9/2002 | Beerling et al. |
| 6,464,333 B1 | 10/2002 | Scheffelin et al. |
| 6,543,879 B1 | 4/2003 | Feinn et al. |
| 6,554,399 B2 | 4/2003 | Wong et al. |
| 6,560,871 B1 | 5/2003 | Ramos et al. |
| 6,634,736 B2 | 10/2003 | Miyakoshi et al. |
| 6,666,546 B1 | 12/2003 | Buswell et al. |
| 6,676,245 B2 | 1/2004 | Silverbrook |
| 6,767,089 B2 | 7/2004 | Buswell et al. |
| 6,866,790 B2 | 3/2005 | Milligan et al. |
| 6,869,166 B2 | 3/2005 | Brugue et al. |
| 6,896,359 B1 | 5/2005 | Miyazaki et al. |
| 6,930,055 B1 | 8/2005 | Bhowmik et al. |
| 6,938,340 B2 | 9/2005 | Haluzak et al. |
| 6,962,406 B2 | 11/2005 | Kawamura et al. |
| 6,997,540 B2 | 2/2006 | Horvath et al. |
| 7,051,426 B2 | 5/2006 | Buswell |
| 7,185,968 B2 | 3/2007 | Kim et al. |
| 7,188,942 B2 | 3/2007 | Haines et al. |
| 7,238,293 B2 | 7/2007 | Donaldson et al. |
| 7,240,991 B2 | 7/2007 | Timm et al. |
| 7,347,533 B2 | 3/2008 | Elrod et al. |
| 7,490,924 B2 | 2/2009 | Haluzak et al. |
| 7,498,666 B2 | 3/2009 | Hussa |
| 7,543,924 B2 | 6/2009 | Silverbrook |
| 7,547,094 B2 | 6/2009 | Kawamura et al. |
| 7,591,535 B2 | 9/2009 | Nystrom et al. |
| 7,614,733 B2 | 11/2009 | Haines et al. |
| 7,658,467 B2 | 2/2010 | Silverbrook |
| 7,658,470 B1 | 2/2010 | Jones et al. |
| 7,727,411 B2 | 6/2010 | Yamamuro et al. |
| 7,824,013 B2 | 11/2010 | Chung-Long et al. |
| 7,828,417 B2 | 11/2010 | Haluzak et al. |
| 7,862,160 B2 | 1/2011 | Andrews et al. |
| 7,877,875 B2 | 2/2011 | O'Farrell et al. |
| 8,063,318 B2 | 11/2011 | Williams et al. |
| 8,091,234 B2 | 1/2012 | Ibe et al. |
| 8,101,438 B2 | 1/2012 | McAvoy et al. |
| 8,118,406 B2 | 2/2012 | Ciminelli et al. |
| 8,163,463 B2 | 4/2012 | Kim et al. |
| 8,177,330 B2 | 5/2012 | Suganuma et al. |
| 8,197,031 B2 | 6/2012 | Stephens et al. |
| 8,235,500 B2 | 8/2012 | Nystrom et al. |
| 8,246,141 B2 | 8/2012 | Petruchik et al. |
| 8,272,130 B2 | 9/2012 | Miyazaki |
| 8,287,104 B2 | 10/2012 | Sharan et al. |
| 8,342,652 B2 | 1/2013 | Nystrom et al. |
| 8,405,232 B2 | 3/2013 | Hsu et al. |
| 8,429,820 B2 | 4/2013 | Koyama et al. |
| 8,439,485 B2 | 5/2013 | Tamaru et al. |
| 8,454,130 B2 | 6/2013 | Iinuma |
| 8,476,748 B1 | 7/2013 | Darveaux et al. |
| 8,485,637 B2 | 7/2013 | Dietl |
| 8,496,317 B2 | 7/2013 | Ciminelli et al. |
| 9,446,587 B2 | 9/2016 | Chen et al. |
| 9,724,920 B2 | 8/2017 | Chen et al. |
| 9,731,509 B2 | 8/2017 | Chen et al. |
| 9,844,946 B2 | 12/2017 | Chen et al. |
| 9,944,080 B2 | 4/2018 | Chen et al. |
| 2001/0037808 A1 | 11/2001 | Deem et al. |
| 2002/0024569 A1 | 2/2002 | Silverbrook |
| 2002/0030720 A1 | 3/2002 | Kawamura et al. |
| 2002/0033867 A1 | 3/2002 | Silverbrook |
| 2002/0041308 A1 | 4/2002 | Cleland et al. |
| 2002/0051036 A1 | 5/2002 | Scheffelin et al. |
| 2002/0122097 A1 | 9/2002 | Beerling et al. |
| 2002/0180825 A1 | 12/2002 | Buswell et al. |
| 2002/0180846 A1 | 12/2002 | Silverbrook |
| 2003/0007034 A1 | 1/2003 | Horvath et al. |
| 2003/0052944 A1 | 3/2003 | Scheffelin |
| 2003/0081053 A1 | 5/2003 | Barinaga et al. |
| 2003/0090558 A1 | 5/2003 | Coyle et al. |
| 2003/0140496 A1 | 7/2003 | Buswell et al. |
| 2003/0156160 A1 | 8/2003 | Yamaguchi et al. |
| 2003/0169308 A1 | 9/2003 | Audi et al. |
| 2004/0032468 A1 | 2/2004 | Killmeier et al. |
| 2004/0055145 A1 | 3/2004 | Buswell |
| 2004/0084404 A1 | 5/2004 | Donaldson et al. |
| 2004/0095422 A1 | 5/2004 | Eguchi et al. |
| 2004/0119774 A1 | 6/2004 | Conta et al. |
| 2004/0196334 A1 | 10/2004 | Cornell |
| 2004/0201641 A1 | 10/2004 | Brugue et al. |
| 2004/0233254 A1 | 11/2004 | Kim |
| 2005/0018016 A1 | 1/2005 | Silverbrook |
| 2005/0024444 A1 | 2/2005 | Conta et al. |
| 2005/0030358 A1 | 2/2005 | Haines et al. |
| 2005/0046663 A1 | 3/2005 | Silverbrook |
| 2005/0116995 A1 | 6/2005 | Tanikawa et al. |
| 2005/0122378 A1 | 6/2005 | Touge |
| 2005/0162466 A1 | 7/2005 | Silverbrook et al. |
| 2006/0022273 A1 | 2/2006 | Halk |
| 2006/0028510 A1 | 2/2006 | Park et al. |
| 2006/0066674 A1 | 3/2006 | Sugahara |
| 2006/0132543 A1 | 6/2006 | Elrod et al. |
| 2006/0175726 A1 | 8/2006 | Kachi |
| 2006/0209110 A1 | 9/2006 | Vinas et al. |
| 2006/0243387 A1 | 11/2006 | Haluzak et al. |
| 2006/0256162 A1 | 11/2006 | Hayakawa |
| 2006/0280540 A1 | 12/2006 | Han |
| 2007/0153070 A1 | 7/2007 | Haines et al. |
| 2007/0188561 A1 | 8/2007 | Eguchi et al. |
| 2007/0211095 A1 | 9/2007 | Hirayama |
| 2008/0061393 A1 | 3/2008 | Yen |
| 2008/0079781 A1 | 4/2008 | Shim et al. |
| 2008/0149024 A1 | 6/2008 | Petruchik et al. |
| 2008/0174636 A1 | 7/2008 | Kim et al. |
| 2008/0186367 A1 | 8/2008 | Adkins et al. |
| 2008/0239002 A1 | 10/2008 | Nystrom et al. |

(56) References Cited

U.S. PATENT DOCUMENTS

| | | |
|---|---|---|
| 2008/0259125 A1 | 10/2008 | Haluzak et al. |
| 2008/0291243 A1 | 11/2008 | Osaki |
| 2008/0292986 A1 | 11/2008 | Park et al. |
| 2008/0297564 A1 | 12/2008 | Jeong et al. |
| 2009/0009559 A1 | 1/2009 | Jindai et al. |
| 2009/0011185 A1 | 1/2009 | Giri et al. |
| 2009/0014413 A1 | 1/2009 | Nystrom et al. |
| 2009/0022199 A1 | 1/2009 | Jikutani et al. |
| 2009/0051717 A1 | 2/2009 | Kuwahara |
| 2009/0086449 A1 | 4/2009 | Minamio et al. |
| 2009/0225131 A1 | 9/2009 | Chen et al. |
| 2009/0256891 A1 | 10/2009 | Anderson et al. |
| 2009/0267994 A1 | 10/2009 | Suganuma et al. |
| 2010/0035373 A1 | 2/2010 | Hunziker et al. |
| 2010/0079542 A1 | 4/2010 | Ciminelli et al. |
| 2010/0156989 A1 | 6/2010 | Petruchik |
| 2010/0224983 A1 | 9/2010 | Huang et al. |
| 2010/0271445 A1 | 10/2010 | Sharan et al. |
| 2010/0302311 A1 | 12/2010 | Blair et al. |
| 2011/0018941 A1 | 1/2011 | McAvoy et al. |
| 2011/0019210 A1 | 1/2011 | Chung et al. |
| 2011/0037808 A1* | 2/2011 | Ciminelli ............ B41J 2/14072 347/50 |
| 2011/0080450 A1 | 4/2011 | Ciminelli et al. |
| 2011/0115852 A1 | 5/2011 | Bibl et al. |
| 2011/0141691 A1 | 6/2011 | Slaton et al. |
| 2011/0222239 A1 | 9/2011 | Dede |
| 2011/0292121 A1 | 12/2011 | McAvoy et al. |
| 2011/0292124 A1 | 12/2011 | Anderson et al. |
| 2011/0292126 A1 | 12/2011 | Nystrom et al. |
| 2011/0296688 A1 | 12/2011 | Fielder et al. |
| 2011/0298868 A1 | 12/2011 | Fielder et al. |
| 2011/0304673 A1 | 12/2011 | Ciminelli et al. |
| 2012/0000595 A1 | 1/2012 | Mase et al. |
| 2012/0003902 A1 | 1/2012 | Mase et al. |
| 2012/0019593 A1 | 1/2012 | Scheffelin et al. |
| 2012/0061857 A1 | 3/2012 | Ramadoss et al. |
| 2012/0098114 A1 | 4/2012 | Ishibashi |
| 2012/0120158 A1 | 5/2012 | Sakai et al. |
| 2012/0124835 A1 | 5/2012 | Okano et al. |
| 2012/0132874 A1 | 5/2012 | Iwama |
| 2012/0154486 A1 | 6/2012 | Anderson et al. |
| 2012/0186079 A1 | 7/2012 | Ciminelli |
| 2012/0188307 A1 | 7/2012 | Ciminelli |
| 2012/0210580 A1 | 8/2012 | Dietl |
| 2012/0212540 A1 | 8/2012 | Dietl |
| 2012/0242752 A1 | 9/2012 | Mou et al. |
| 2013/0026130 A1 | 1/2013 | Watanabe |
| 2013/0027466 A1 | 1/2013 | Petruchik et al. |
| 2013/0029056 A1 | 1/2013 | Asai et al. |
| 2013/0194349 A1 | 8/2013 | Ciminelli et al. |
| 2013/0201256 A1 | 8/2013 | Fricke et al. |
| 2013/0320471 A1 | 12/2013 | Luan |
| 2014/0028768 A1 | 1/2014 | Chen |
| 2016/0001552 A1 | 1/2016 | Chen et al. |
| 2016/0001558 A1 | 1/2016 | Chen et al. |
| 2016/0009084 A1 | 1/2016 | Chen et al. |
| 2016/0009085 A1 | 1/2016 | Chen et al. |
| 2016/0016404 A1 | 1/2016 | Chen et al. |
| 2017/0008281 A1 | 1/2017 | Chen et al. |
| 2018/0141337 A1 | 5/2018 | Chen et al. |
| 2018/0326724 A1 | 11/2018 | Chen et al. |

FOREIGN PATENT DOCUMENTS

| | | | |
|---|---|---|---|
| CN | 1297815 A | 6/2001 | |
| CN | 1314244 A | 9/2001 | |
| CN | 1512936 A | 7/2004 | |
| CN | 1530229 A | 9/2004 | |
| CN | 1541839 A | 11/2004 | |
| CN | 1593924 A | 3/2005 | |
| CN | 1622881 A | 6/2005 | |
| CN | 1872554 A | 12/2006 | |
| CN | 1903578 A | 1/2007 | |
| CN | 1903579 A | 1/2007 | |
| CN | 101020389 A | 8/2007 | |
| CN | 101085573 A | 12/2007 | |
| CN | 101124519 A | 2/2008 | |
| CN | 101163591 A | 4/2008 | |
| CN | 101274514 A | 10/2008 | |
| CN | 101274515 A | 10/2008 | |
| CN | 101372172 A | 2/2009 | |
| CN | 101607477 A | 12/2009 | |
| CN | 101668696 A | 3/2010 | |
| CN | 101668698 A | 3/2010 | |
| CN | 101909893 A | 12/2010 | |
| CN | 102470672 A | 5/2012 | |
| CN | 102596575 A | 7/2012 | |
| CN | 102673155 A | 9/2012 | |
| CN | 102689511 A | 9/2012 | |
| CN | 102689512 A | 9/2012 | |
| CN | 103052508 A | 4/2013 | |
| DE | 102011078906 A1 | 1/2013 | |
| DE | 102011084582 B3 | 2/2013 | |
| EP | 0705698 A2 | 4/1996 | |
| EP | 0755793 A2 | 1/1997 | |
| EP | 0822078 A2 | 2/1998 | |
| EP | 1027991 A2 | 8/2000 | |
| EP | 1080907 A2 | 3/2001 | |
| EP | 1095773 | 5/2001 | |
| EP | 1264694 A1 | 12/2002 | |
| EP | 1386740 A1 | 2/2004 | |
| EP | 1518685 A1 | 3/2005 | |
| EP | 1827844 A1 | 9/2007 | |
| EP | 1908593 A1 | 4/2008 | |
| JP | 60-262649 A | 12/1985 | |
| JP | 61125852 A | 6/1986 | |
| JP | 62-240562 A | 10/1987 | |
| JP | 04-292950 A | 10/1992 | |
| JP | 06-015824 A | 1/1994 | |
| JP | 06-226977 A | 8/1994 | |
| JP | 07-227970 A | 8/1995 | |
| JP | H09-001812 | 1/1997 | |
| JP | 09-029970 A | 2/1997 | |
| JP | 09-131871 A | 5/1997 | |
| JP | 11-091108 A | 4/1999 | |
| JP | 11-208000 A | 8/1999 | |
| JP | 2001071490 | 3/2001 | |
| JP | 2000108360 | 4/2001 | |
| JP | 2001-246748 A | 9/2001 | |
| JP | 2002-291262 A | 10/2002 | |
| JP | 2003-011365 A | 1/2003 | |
| JP | 2003-063010 A | 3/2003 | |
| JP | 2003-063020 A | 3/2003 | |
| JP | 2004-148827 A | 5/2004 | |
| JP | 2004-517755 A | 6/2004 | |
| JP | 2005-088587 A | 4/2005 | |
| JP | 2005-161710 A | 6/2005 | |
| JP | 2005-212134 A | 8/2005 | |
| JP | 2006-009149 A | 1/2006 | |
| JP | 2006-224624 A | 8/2006 | |
| JP | 2006-315321 A | 11/2006 | |
| JP | 2006321222 | 11/2006 | |
| JP | 2007-531645 A | 11/2007 | |
| JP | 2008-009149 A | 1/2008 | |
| JP | 2008-087478 A | 4/2008 | |
| JP | 2008-511130 A | 4/2008 | |
| JP | 2009-255448 | 11/2009 | |
| JP | 2010-023341 | 2/2010 | |
| JP | 2010-050452 A | 3/2010 | |
| JP | 2010137460 | 6/2010 | |
| JP | 2010-524713 A | 7/2010 | |
| JP | 2011-240516 A | 12/2011 | |
| JP | 2012-158150 A | 8/2012 | |
| JP | 2013-501655 | 1/2013 | |
| JP | 2015-217679 A | 12/2015 | |
| KR | 10-2002-0025590 A | 4/2002 | |
| KR | 10-2004-0097848 A | 11/2004 | |
| KR | 10-2012-0079171 A | 7/2012 | |
| KR | 2012-0079171 A | 7/2012 | |
| TW | 501979 B | 9/2002 | |
| TW | 503181 B | 9/2002 | |
| TW | I295632 B | 4/2008 | |

(56) References Cited

FOREIGN PATENT DOCUMENTS

| | | |
|---|---|---|
| TW | 200903685 A | 1/2009 |
| TW | 200926385 A | 6/2009 |
| TW | 200932658 A | 8/2009 |
| WO | 2006/066306 A1 | 6/2006 |
| WO | WO-2008134202 A1 | 11/2008 |
| WO | 2008/151216 A1 | 12/2008 |
| WO | 2011/001952 A1 | 1/2011 |
| WO | 2011/019529 A1 | 2/2011 |
| WO | 2011/058719 A1 | 5/2011 |
| WO | 2012/011972 A1 | 1/2012 |
| WO | 2012/023939 A1 | 2/2012 |
| WO | 2012/023941 A1 | 2/2012 |
| WO | 2012/106661 A2 | 8/2012 |
| WO | WO-2012134480 | 10/2012 |
| WO | 2013/016048 A1 | 1/2013 |
| WO | 2014/013356 A1 | 1/2014 |
| WO | 2014/133516 A1 | 9/2014 |
| WO | 2014/133561 A1 | 9/2014 |
| WO | 2014/133575 A1 | 9/2014 |
| WO | 2014/133576 A1 | 9/2014 |
| WO | 2014/133577 A1 | 9/2014 |
| WO | 2014/133578 A1 | 9/2014 |
| WO | 2014/133600 A1 | 9/2014 |
| WO | 2014/153305 A1 | 9/2014 |

OTHER PUBLICATIONS

Lee, J-D. et al.; A Thermal Inkjet Printhead with a Monolithically Fabricated Nozzle Plate and Self-aligned Ink Feed Hole; http://ieeexplore.ieee.org/stamp/stamp.jsp?tp=&arnumber=788625; pp. 229-236; vol. 8; Issue 3; Sep. 1999.

Lindemann, T. et al.; One Inch Thermal Bubble Jet Printhead with Laser Structured Integrated Polyimide Nozzle Plate; http://ieeexplore.ieee.org/stamp/stamp.jsp?tp=&arnumber=4147592; pp. 420-428; vol. 16; Issue 2; Apr. 2007.

Chen Yue Cheng et al.; A Monolithic Thermal Inkjet Printhead Combining Anisotropic Etching and Electro Plating; In Input/Output and Imaging Technologies II, 246 Proceedings of SPIE vol. 4080 Jul. 26-27, 2007; pp. 245-252.

European Patent Office, Communication pursuant to Rule 164(1) EPC for Appl No. 13876407.1 dated Jan. 5, 2017 (7 pages).

European Patent Office, Extended European Search Report for Appl. No. 13876407.1 dated May 31, 2017 (18 pages).

Hayes, D.J. et al.; Microjet Printing of Solder and Polymers for Multi-chip Modules and Chip-scale Packages http://citeseerx.ist.psu.edu/viewdoc/download?doi=10.1.1.88.3951&rep=rep1-&type=pdf >; May 14, 1999.

International Search Report & Written Opinion received for PCT Application No. PCT/US2013/074925, dated Mar. 20, 2014, 14 pages.

Korean Intellectual Property Office, International Search Report and Written Opinion for PCT/US2013/062221 dated Dec. 19, 2013 (13 pages).

Miettinen et al; Molded Substrates for Inkjet Printed Modules; IEEE Transactions On Components and Packaging Technologies, vol. 32, No. 2, Jun. 2009 293; pp. 293-301.

Yim, M.J. et al.; Ultra Thin Pop Top Package Using Compression Mold; It's Warpage Control; http://ieeexplore.ieee.org/xpl/articleDetails.jsp?tp=&arnumber=5898654&qu-eryText%3Dmold+cap+thick* >; On pp. 1141-1146; May 31-Jun. 3, 2011.

\* cited by examiner

MOLDING A FLUID FLOW STRUCTURE

BACKGROUND

Each printhead die in an inkjet pen or print bar includes tiny channels that carry ink to the ejection chambers. Ink is distributed from the ink supply to the die channels through passages in a structure that supports the printhead die(s) on the pen or print bar. It may be desirable to shrink the size of each printhead die, for example to reduce the cost of the die and, accordingly, to reduce the cost of the pen or print bar. The use of smaller dies, however, can require changes to the larger structures that support the dies, including the passages that distribute ink to the dies.

DRAWINGS

FIGS. 16-21 illustrate one example of a wafer level process for making a print bar such as the print bar shown in FIGS. 1-5.

The same part numbers designate the same or similar parts throughout the figures. The figures are not necessarily to scale. The relative size of some parts is exaggerated to more clearly illustrate the example shown.

DESCRIPTION

Figure 1:
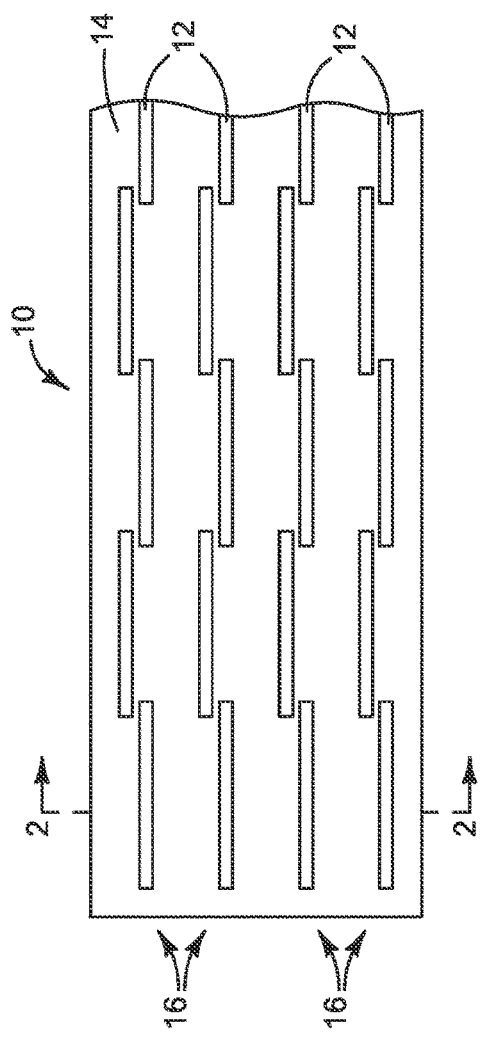
FIGS. 1-5 illustrate an inkjet print bar implementing one example of a new printhead flow structure.

Inkjet printers that utilize a substrate wide print bar assembly have been developed to help increase printing speeds and reduce printing costs. Substrate wide print bar assemblies include multiple parts that carry printing fluid from the printing fluid supplies to the small printhead dies from which the printing fluid is ejected on to the paper or other print substrate. While reducing the size and spacing of the printhead dies continues to be important for reducing cost, channeling printing fluid from the larger supply components to ever smaller, more tightly spaced dies requires complex flow structures and fabrication processes that can actually increase cost.

A new process has been developed for making printhead fluid flow structures that help enable the use of smaller printhead dies in substrate wide inkjet printers. In one example, the new process includes forming fluid flow channels in a body of material surrounding multiple printhead dies such that one or more of the channels contacts a flow passage into each of the dies. In one implementation of this example, the channels are molded into the body simultaneously with molding the body around the dies using a transfer molding tool.

Examples of the new process are not limited to making printhead structures, but may be used to make other devices and for other fluid flow applications. Thus, in one example, the new process includes molding a micro device in a monolithic body of material and forming a fluid flow passage in the body through which fluid can pass directly to the micro device. The micro device, for example, could be an electronic device, a mechanical device, or a microelectromechanical system (MEMS) device. The fluid flow, for example, could be a cooling fluid flow into or onto the micro device or fluid flow into a printhead die or other fluid dispensing micro device.

These and other examples shown in the figures and described below illustrate but do not limit the invention, which is defined in the Claims following this Description.

As used in this document, a "micro device" means a device having one or more exterior dimensions less than or equal to 30 mm; "thin" means a thickness less than or equal to 650 µm; a "sliver" means a thin micro device having a ratio of length to width (L/W) of at least three; a "printhead" and a "printhead die" mean that part of an inkjet printer or other inkjet type dispenser for dispensing fluid from one or more openings. A printhead includes one or more printhead dies. "Printhead" and "printhead die" are not limited to printing with ink and other printing fluids but also include inkjet type dispensing of other fluids and/or for uses other than printing.

FIGS. 1-5 illustrate one example of a new, molded inkjet printhead structure 10. In this example, printhead structure 10 is configured as an elongated print bar such as might be used in a single pass substrate wide printer. FIGS. 6-21 illustrate examples of a new process for making a print bar 10. Referring first to the plan view of FIG. 1, printheads 12 are embedded in an elongated, monolithic body 14 of plastic or other moldable material and arranged generally end to end in rows 16 in a staggered configuration in which the printheads in each row overlap another printhead in that row. A molded body 14 is also referred to herein as a molding 14. Although four rows 16 of staggered printheads 12 are shown, for printing four different colors for example, other suitable configurations are possible.

Figure 2:
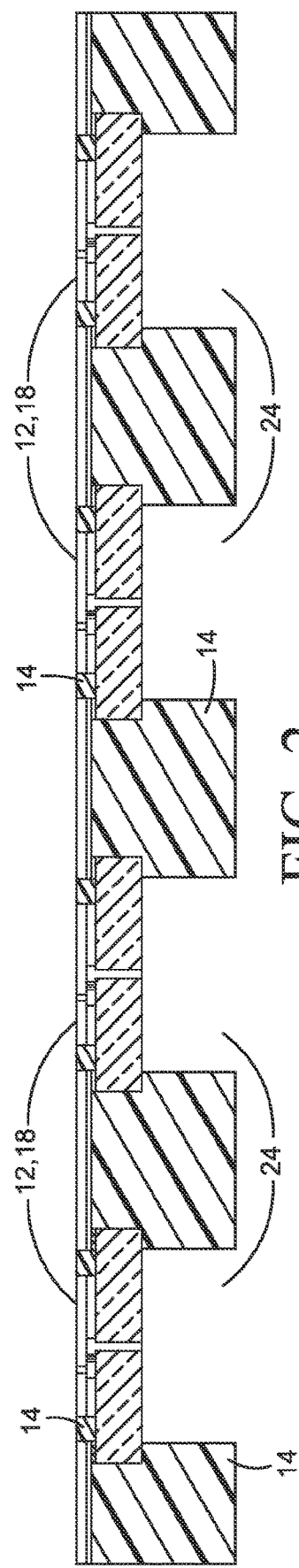
Figure 3:
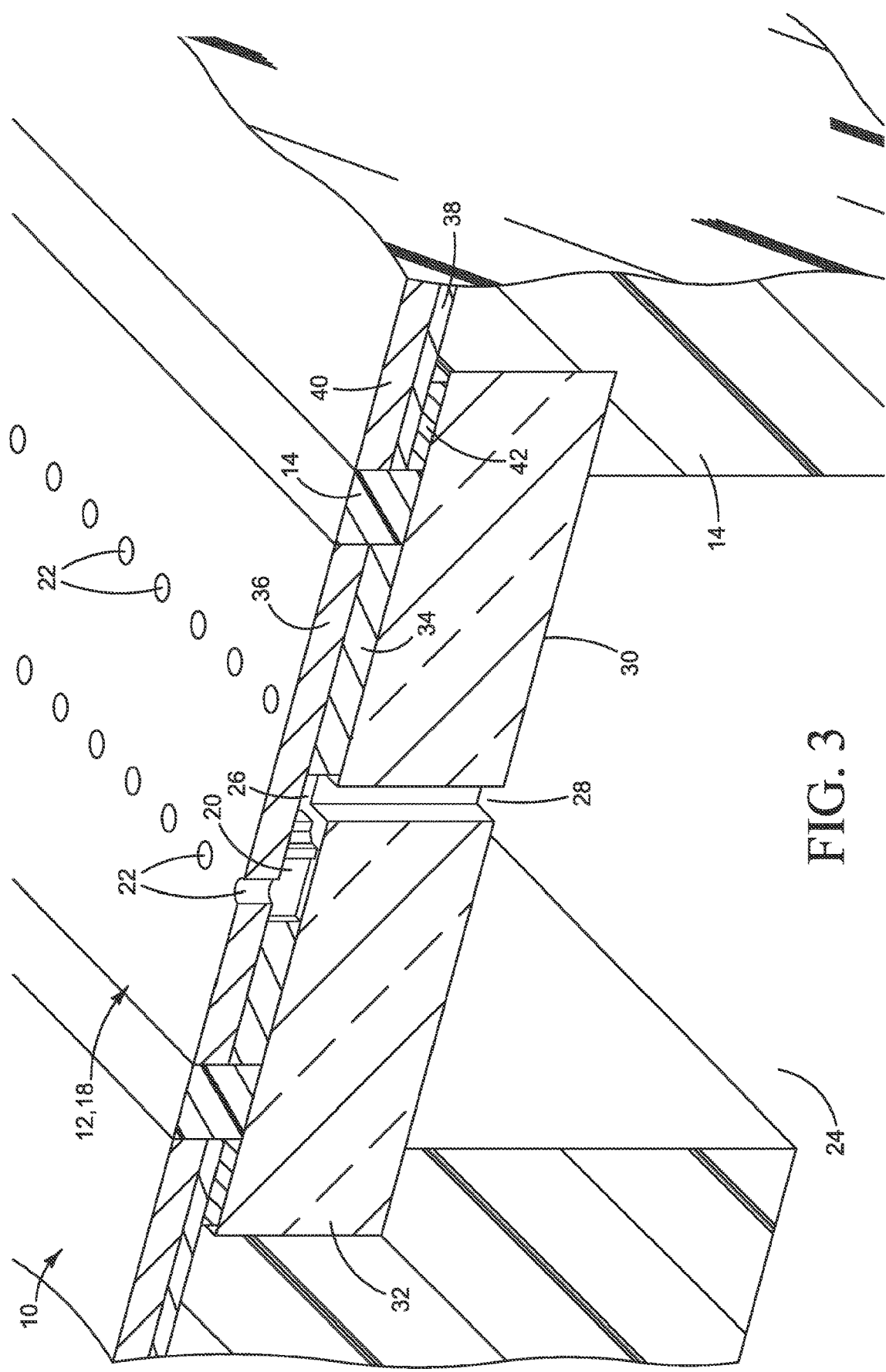
Figure 4:
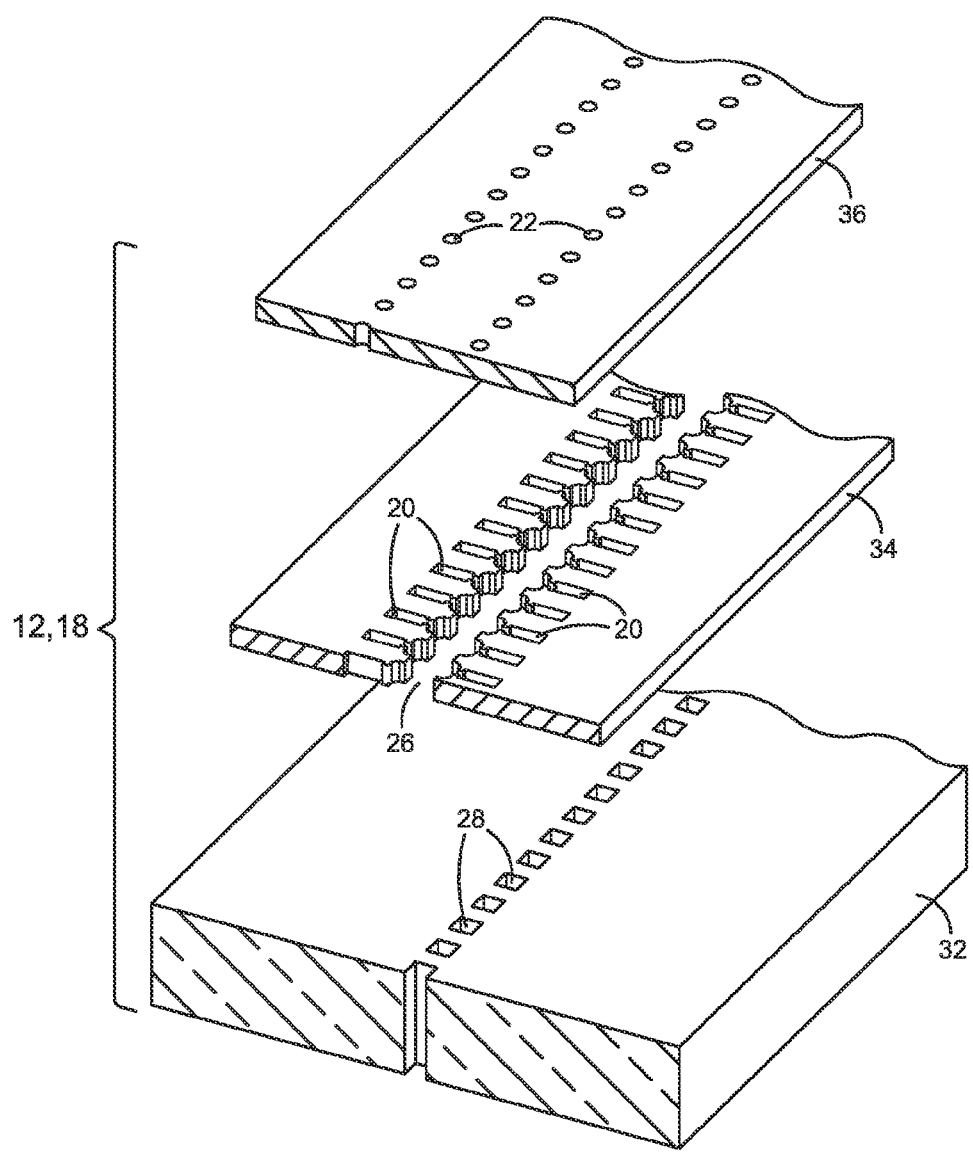
Figure 5:
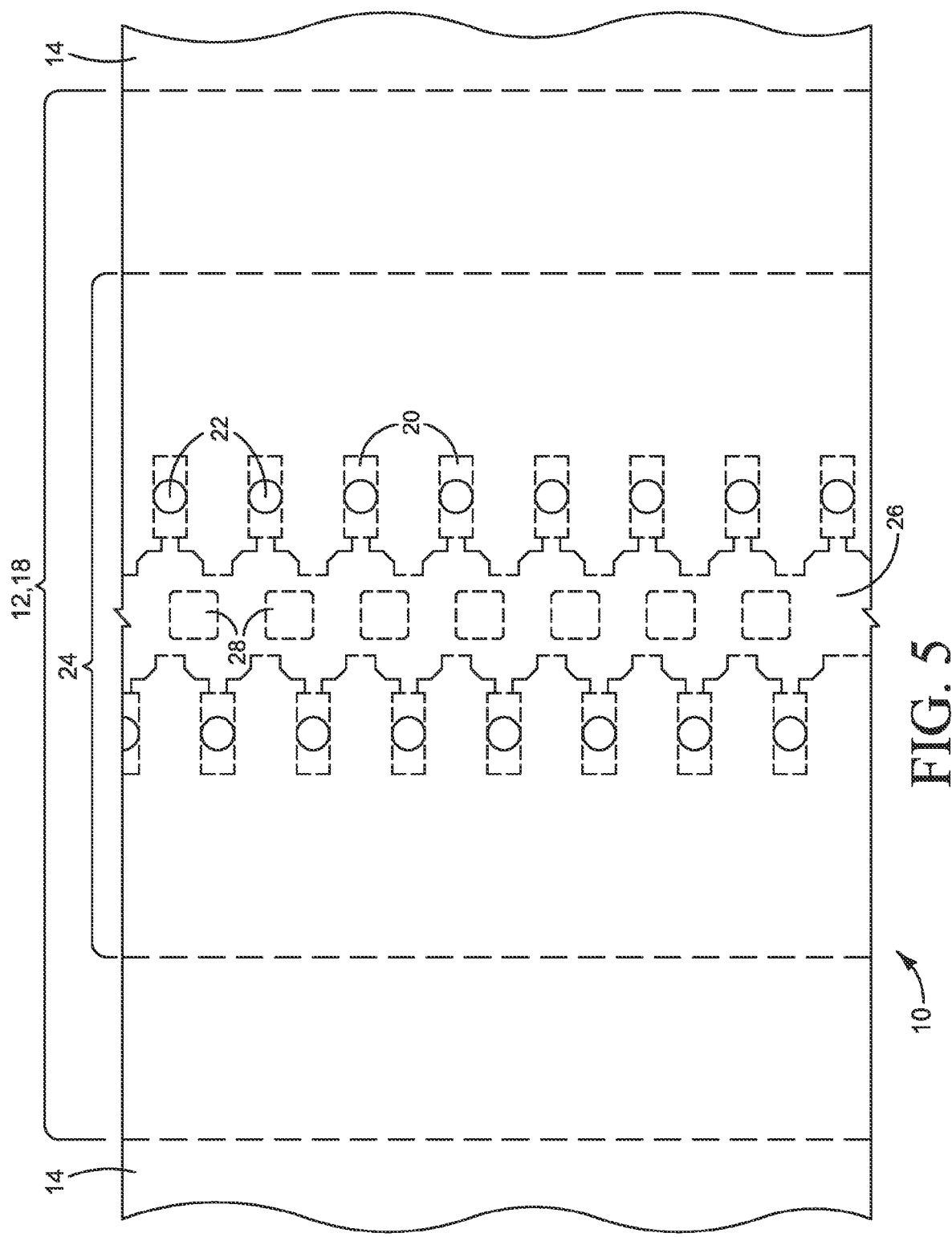

FIG. 2 is a section view taken along the line 2-2 in FIG. 1. FIGS. 3 and 4 are detail views from FIG. 2 and FIG. 5 is a plan view diagram showing the layout of some of the features of printheads 12. Referring now to FIGS. 1-5, in the example shown, each printhead 12 includes a single printhead die 18 with two rows of ejection chambers 20 and corresponding orifices 22 through which printing fluid is ejected from chambers 20. A channel 24 in molding 14 supplies printing fluid to each printhead die 18. Other suitable configurations for each printhead 12 are possible. For example, more or fewer printhead dies 18 may be used with more or fewer ejection chambers 20 and channels 24. Printing fluid flows into each ejection chamber 20 from a manifold 26 extending lengthwise along each die 18 between the two rows of ejection chambers 20. Printing fluid feeds into manifold 26 through multiple ports 28 that are connected to a printing fluid supply channel 24 at die surface 30.

The idealized representation of a printhead die 12 in FIGS. 1-5 depicts three layers 32, 34, 36 for convenience only to clearly show ejection chambers 20, orifices 22, manifold 26, and ports 28. An actual inkjet printhead die 18 is a typically complex integrated circuit (IC) structure formed on a silicon substrate 32 with layers and elements not shown in FIGS. 1-5. For example, a thermal ejector element or a piezoelectric ejector element formed (not shown) on substrate 32 at each ejection chamber 20 is actuated to eject drops or streams of ink or other printing fluid from orifices 22. Conductors 38 covered by a protective layer 40 and attached to electrical terminals 42 on substrate 32 carry electrical signals to ejector and/or other elements of printhead die 18.

Figure 6:
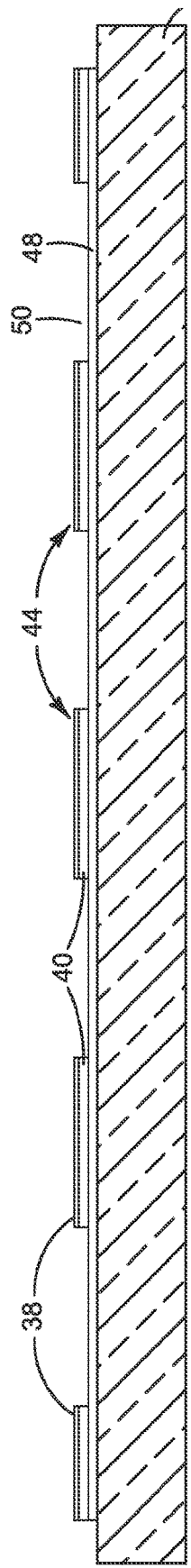
FIGS. 6-11 and 12-15 illustrate example processes for making a printhead flow structure such as might be used in the print bar shown in FIGS. 1-5.
Figure 7:
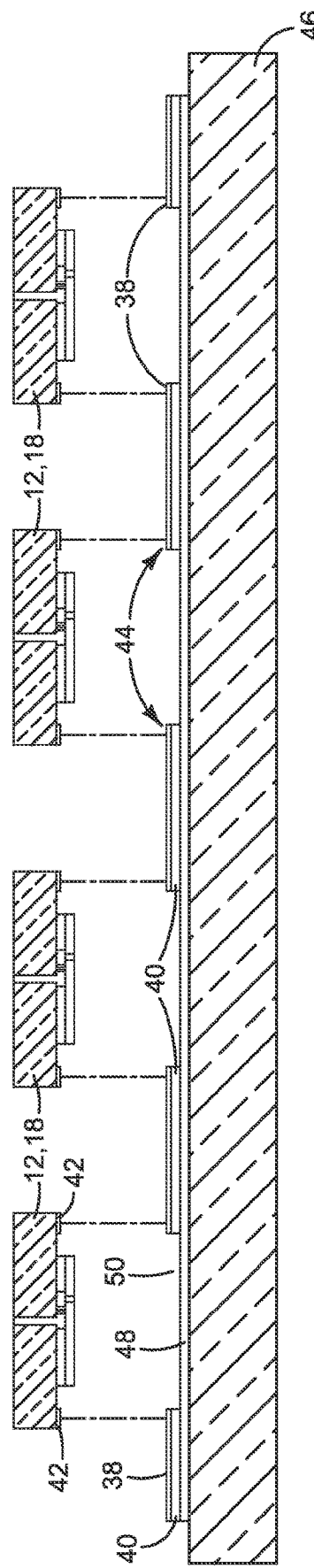
Figure 8:
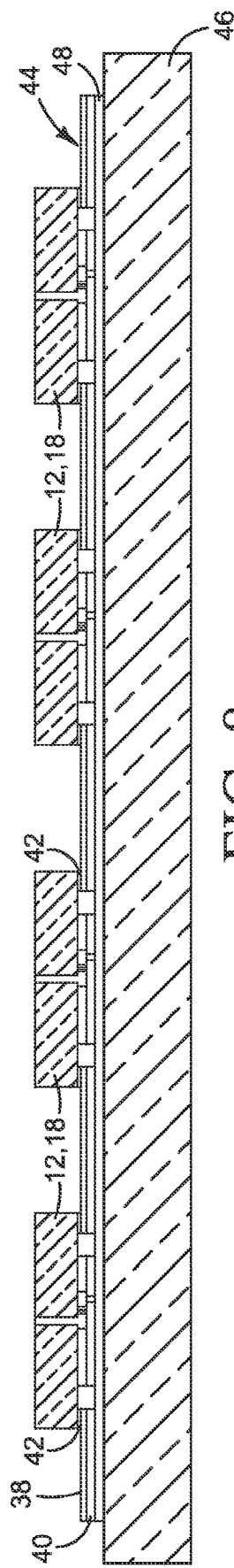
Figure 9:
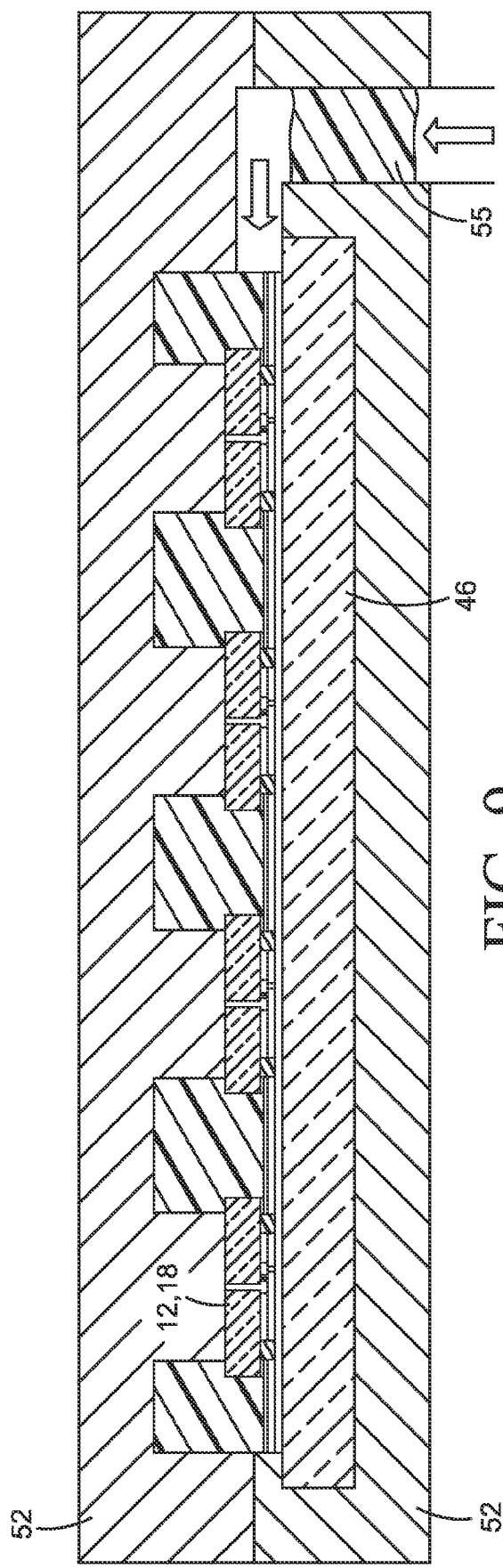
Figure 10:
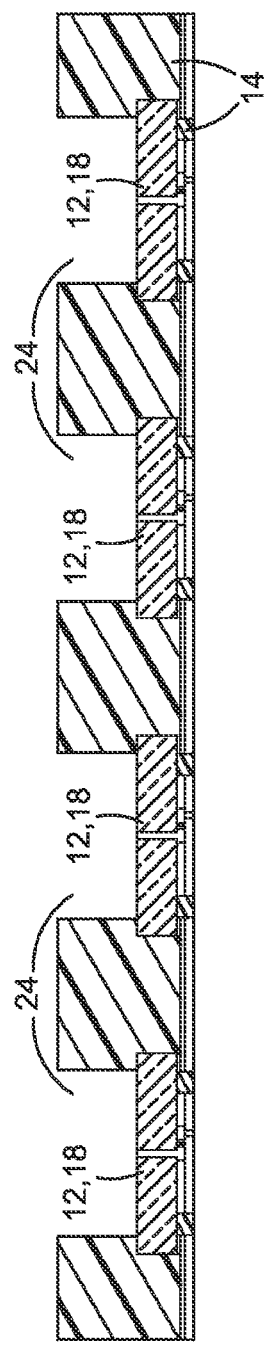
Figure 11:
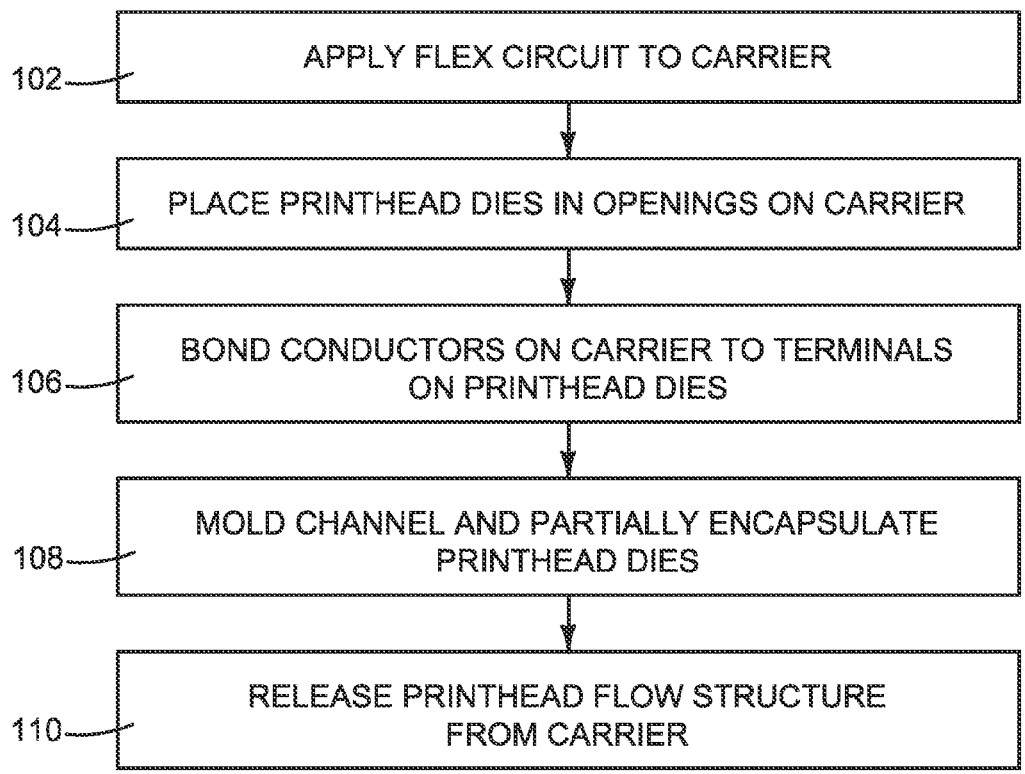
Figure 16:
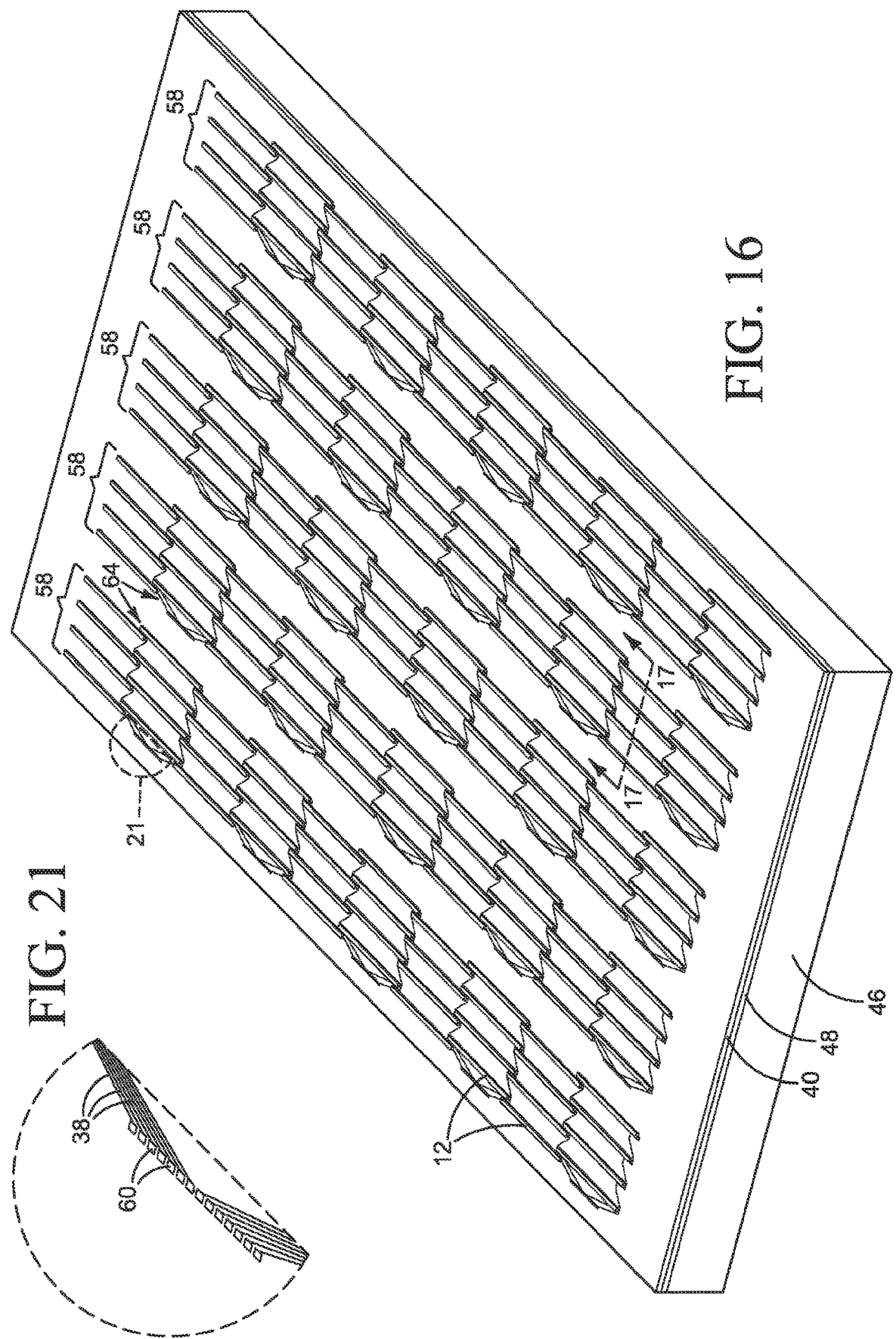

FIGS. 6-10 illustrate one example process for making a print bar 10 such as the one shown in FIGS. 1-5. FIG. 11 is a flow diagram of the process illustrated in FIGS. 6-10. Referring first to FIG. 6, a flex circuit 44 with conductive traces 38 and protective layer 40 is laminated on to a carrier 46 with a thermal release tape 48, or otherwise applied to carrier 46 (step 102 in FIG. 11). Flex circuit 44 may be applied, for example, as a sheet approximately the same size as carrier 46 or in strips connecting multiple dies 18 and bond pads 60 (bond pads 60 are shown in FIGS. 16 and 21). As shown in FIGS. 7 and 8, printhead dies 18 are placed orifice side down in openings 50 on carrier 46 (step 104 in FIG. 11) and conductors 38 bonded to electrical terminal 42 on dies 18 with solder, conductive adhesive, metal-to-metal compression bond or another suitable technique (step 106 in FIG. 11). In FIG. 9, a transfer molding tool 52 forms a monolithic body 14 around printhead dies 18 (step 108 in FIG. 11). In this example, channels 24 are molded into body 14. After molding, print bar 10 is released from carrier 46 (step 110 in FIG. 11) to form the completed part shown in FIG. 10, in which conductors 38 are covered by layer 40 and surrounded by molding 14.

Figure 12:
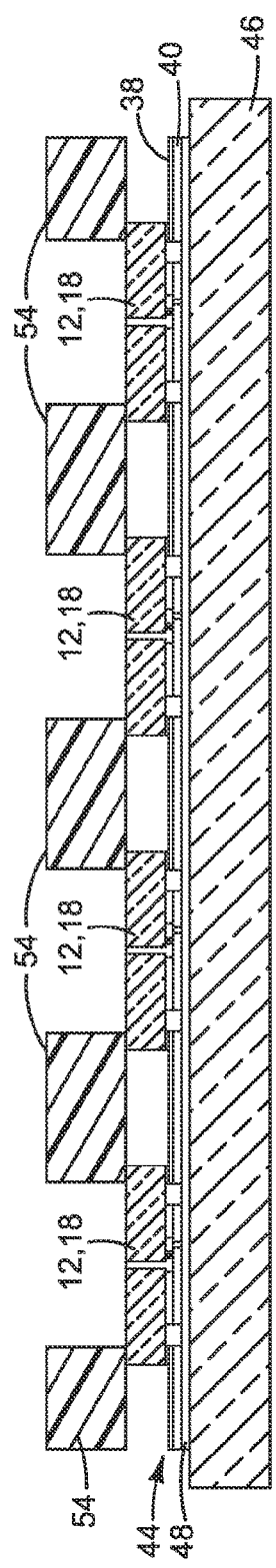
Figure 13:
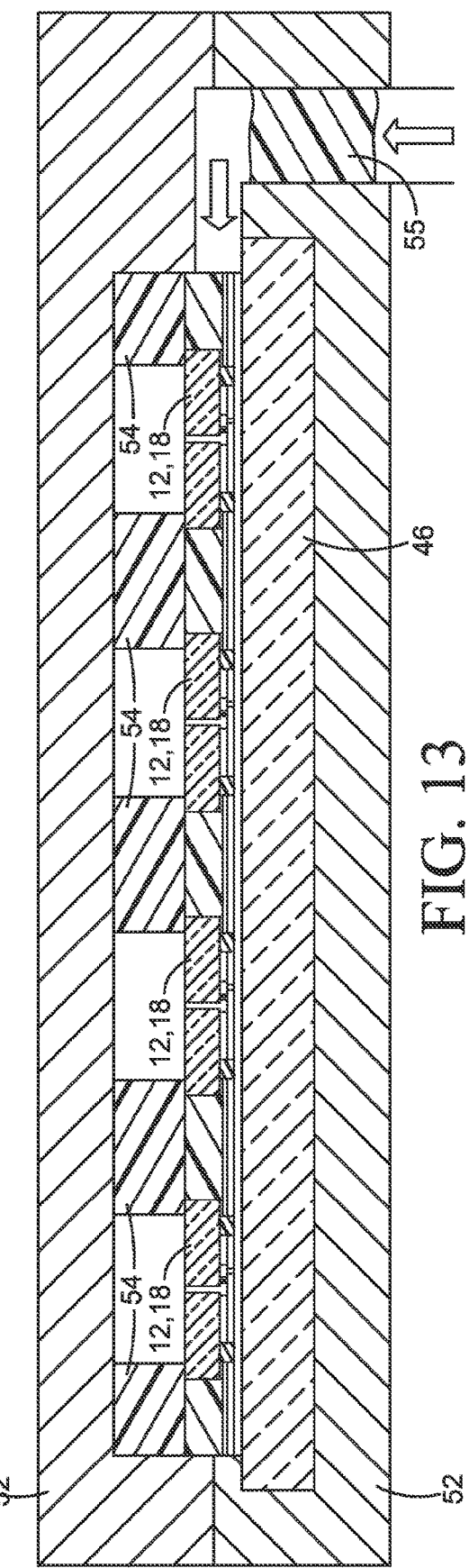
Figure 14:
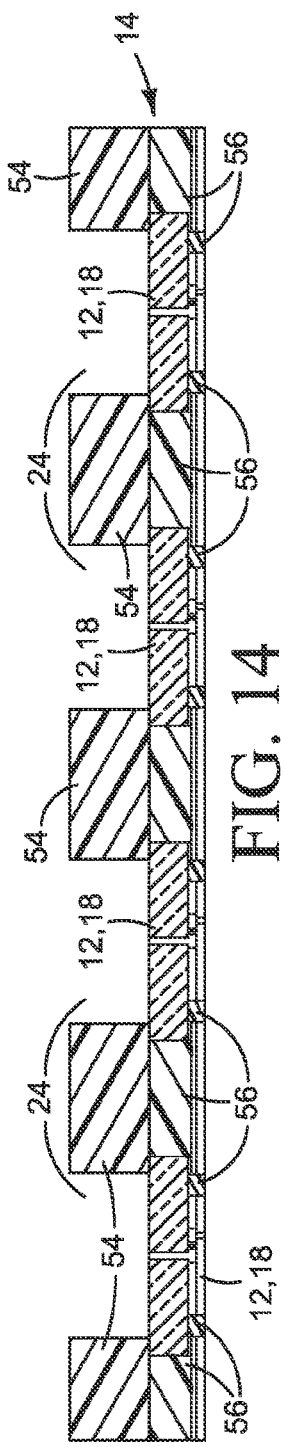
Figure 15:
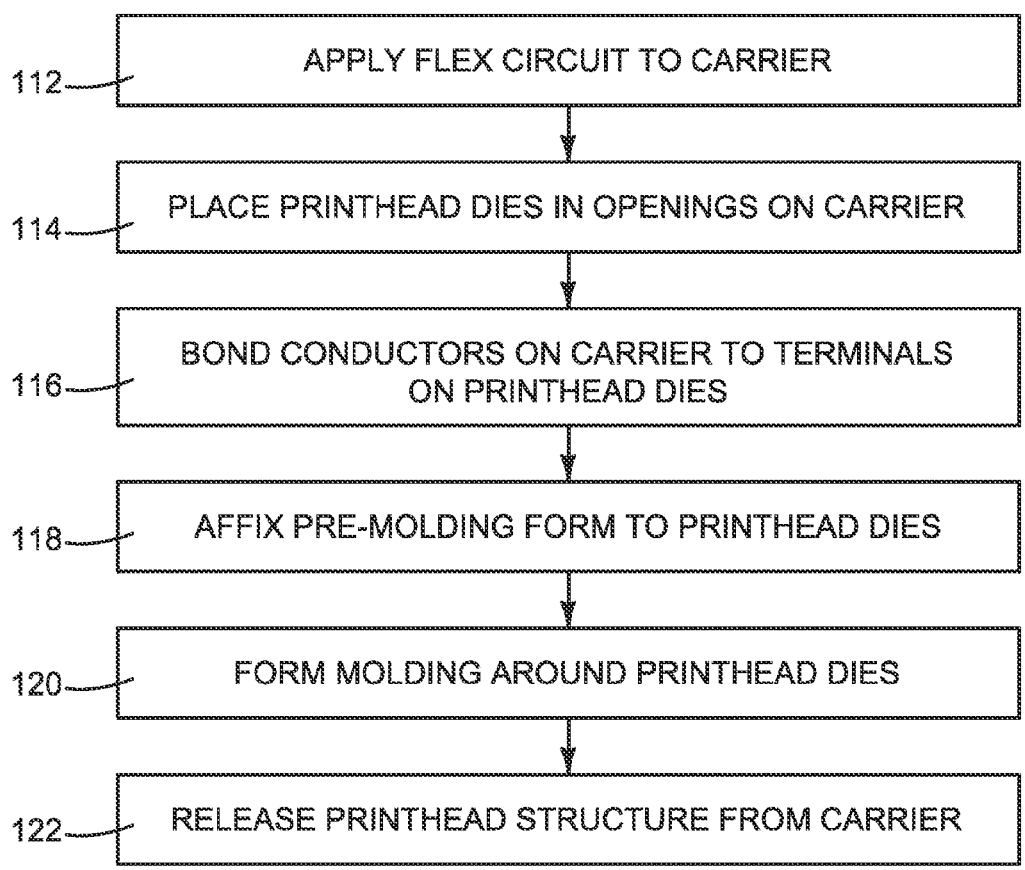

FIGS. 12-14 illustrate another example process for making a print bar 10. FIG. 15 is a flow diagram of the process illustrated in FIGS. 12-14. Referring first to FIG. 12, printhead dies 18 have been placed on carrier 46 over flex circuit 44 as described above with reference to FIGS. 6 and 7 (steps 112, 114 and 116 in FIG. 15) and a pre-molding form 54 is glued or otherwise affixed to the backside of dies 18 in a pattern of the desired configuration for channels 24 (step 118 in FIG. 15). In FIG. 13, a transfer molding tool 52 forms a monolithic molding 56 around printhead dies 18 (step 120 in FIG. 15). In this example, the mold compound 55 flows into the gaps around dies 18 but is blocked from channels 24 by forms 54. Body 14 is thus formed by the combination of pre-molding form 54 and molding 56, with channels 24 defined by form 54. After molding, print bar 10 is released from carrier 46 (step 122 in FIG. 15) to form the completed part shown in FIG. 14.

Defining channels 24 with a pre-molding form 54 allows a simpler molding tool 52 and greater tolerances. Channels 24 in pre-molding form 54 may be considerably wider than ports 28 to allow for a significant misalignment tolerance for form 54 on dies 18. For example, for printing fluid ports 28 that are about 100 µm wide, 300 µm wide channels 24 allow pre-molding form misalignment up to 100 µm without affecting the flow of printing fluid to ports 28. Form 54 may be an epoxy, polymer, stainless steel, printed circuit board laminate or another suitable body material.

FIGS. 16-21 illustrate one example of a wafer level process for making multiple print bars 10. Referring to FIG. 16, printheads 12 are placed on a glass or other suitable carrier wafer 46 in a pattern of multiple print bars. A "wafer" is sometimes used in industry to denote a round substrate while a "panel" is used to denote a rectangular substrate. However, a "wafer" as used in this document includes any shape carrier. Also, although a carrier wafer is shown, a dicing ring with high temperature tape, a lead frame, or another suitable carrier may be used. Printheads 12 may be placed on to carrier 46 after first applying or forming a pattern of conductors 38 and die openings 50 as described above with reference to FIG. 6 and step 102 in FIG. 11.

Figure 17:
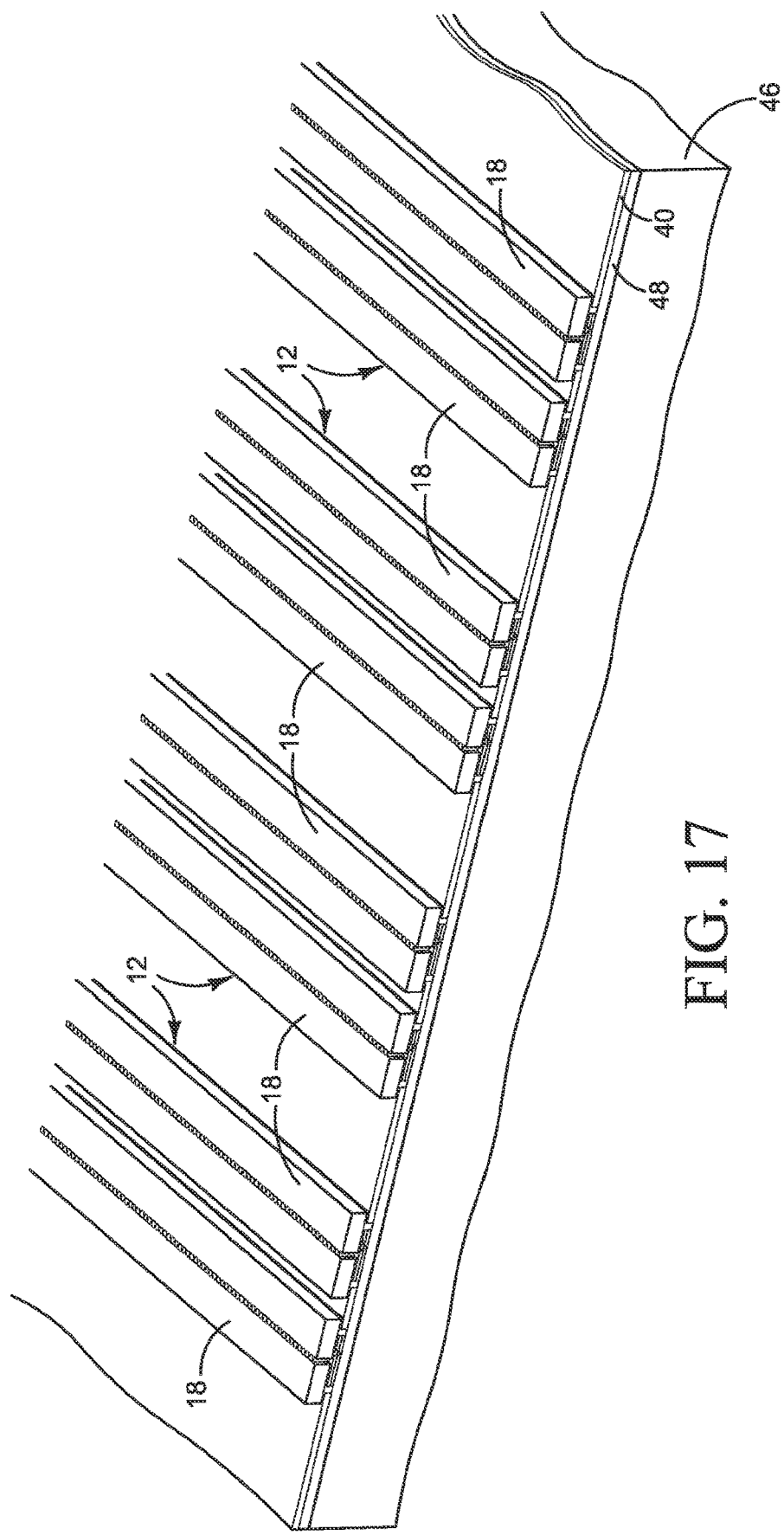
Figure 18:
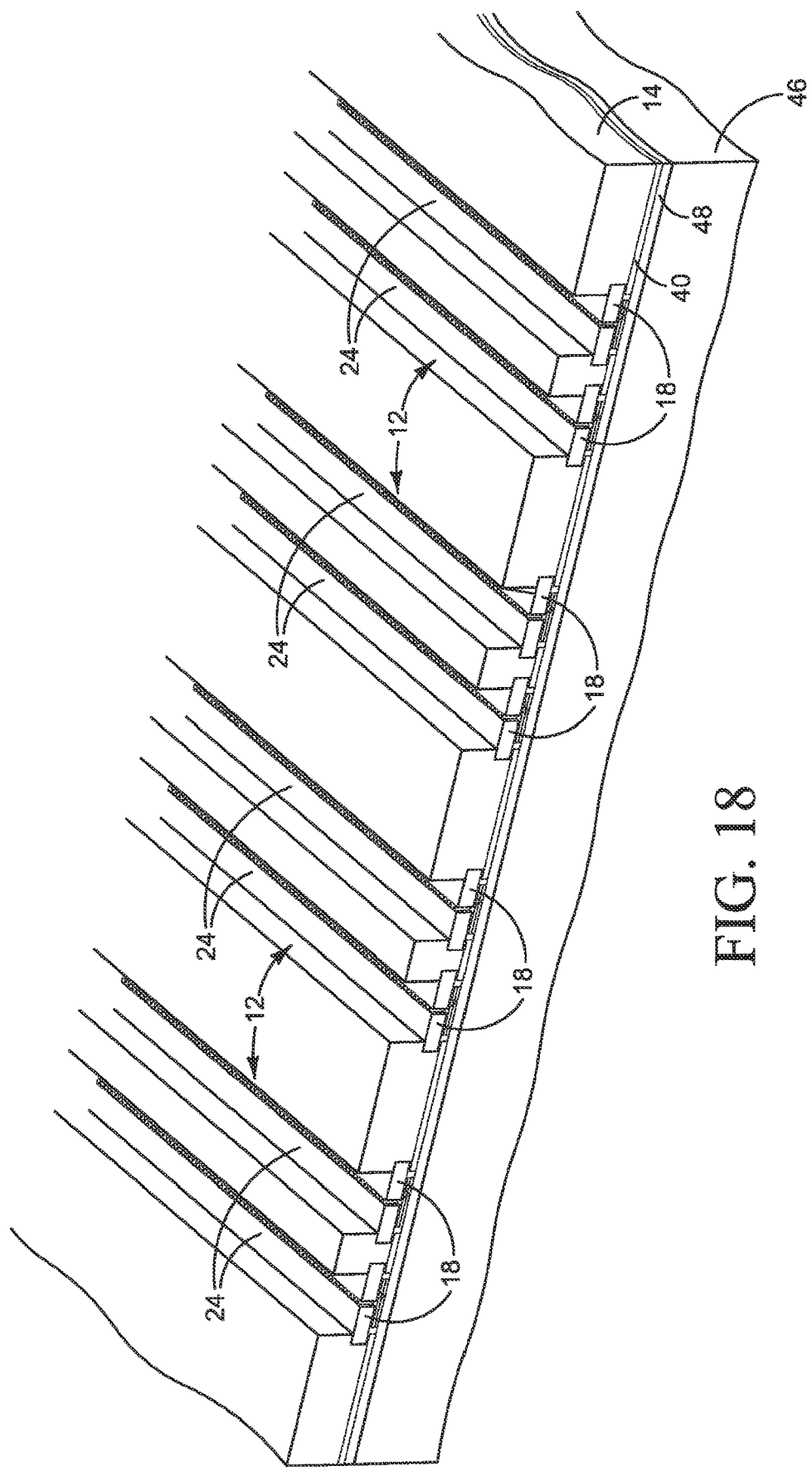
Figure 19:
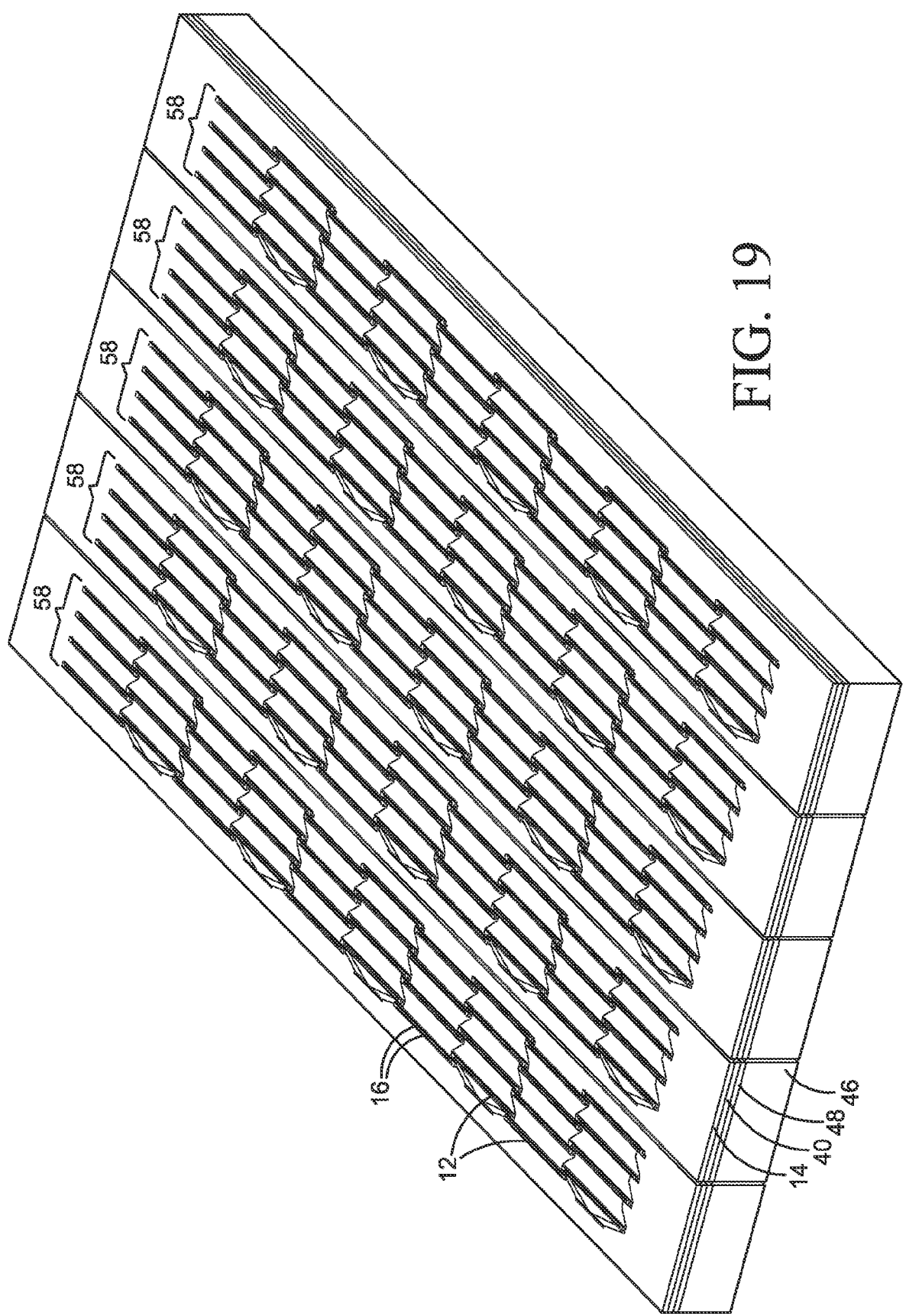
Figure 20:
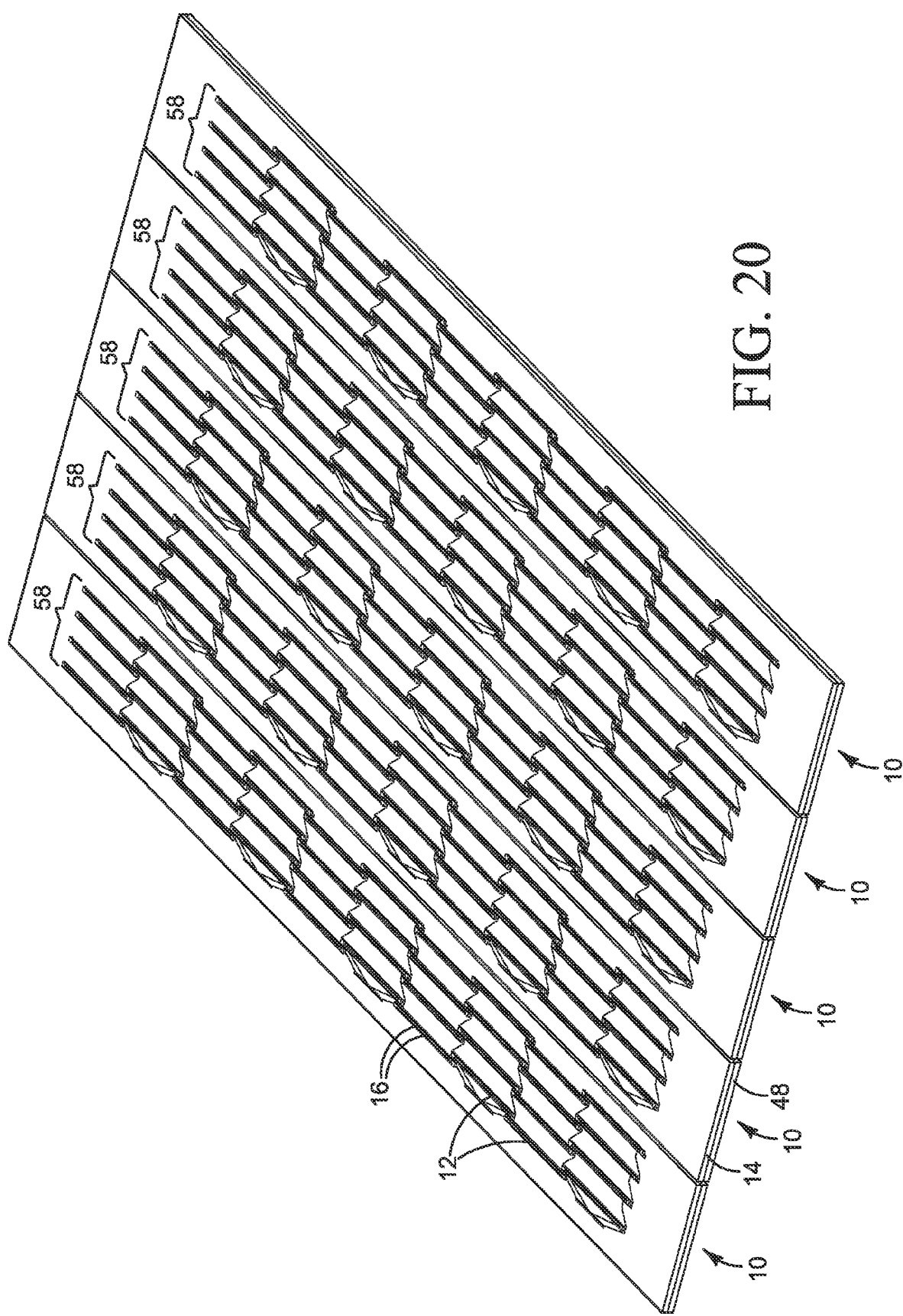

In the example shown in FIG. 16, five sets 58 each having four rows of printheads 12 are laid out on carrier 46 to form five print bars. A substrate wide print bar for printing on Letter or A4 size substrates with four rows of printheads 12, for example, is about 230 mm long and 16 mm wide. Thus, five printhead sets 58 may be laid out on a single 270 mm×90 mm carrier wafer 46 as shown in FIG. 16. FIG. 17 is a close-up section view of one set of four rows of printheads 12 taken along the line 17-17 in FIG. 16. (Cross hatching is omitted in FIG. 17 for clarity.) In the example shown in FIG. 17, each printhead 12 includes a pair of printhead dies 18. Also, an array of conductors 38 extend to bond pads 60 near the edge of each row of printheads 12, as shown in FIGS. 16 and 21. FIG. 18 shows the in-process wafer structure after molding body 14 with channels 24 around printhead dies 18. Individual print bar strips 58 are separated in FIG. 19 and released from carrier 46 in FIG. 20 to form five individual print bars 10.

Figure 22:
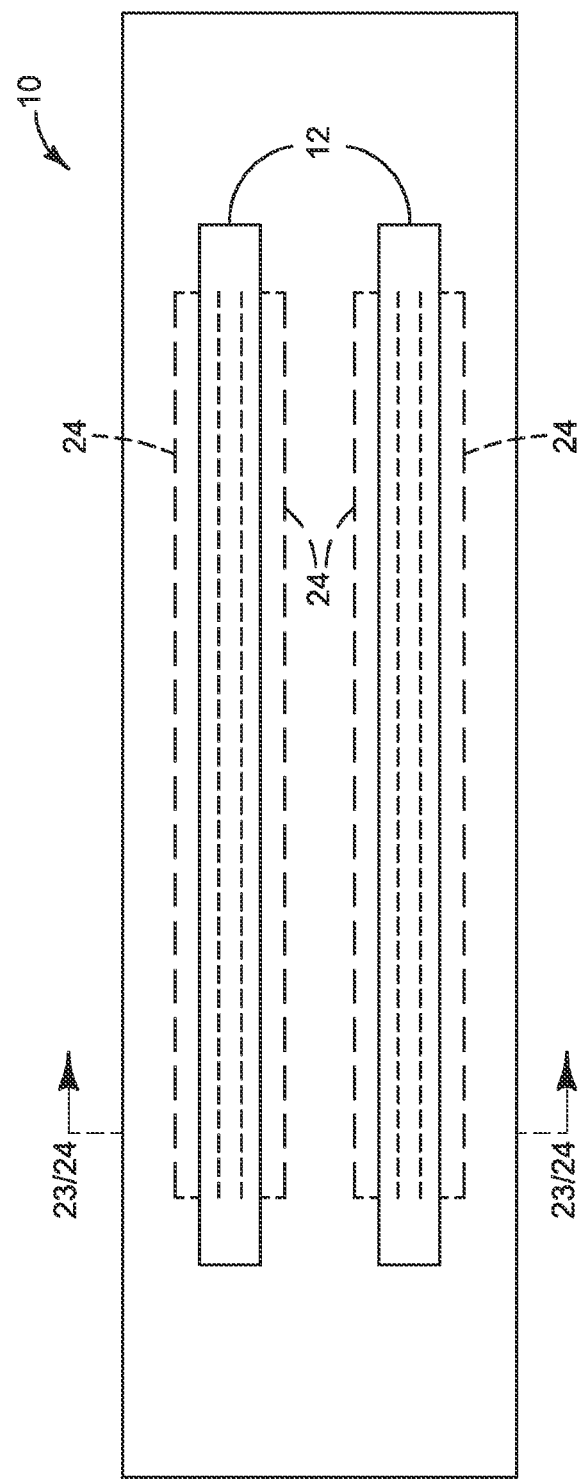
FIGS. 22-24 illustrate other examples of a new printhead flow structure.
Figure 23:
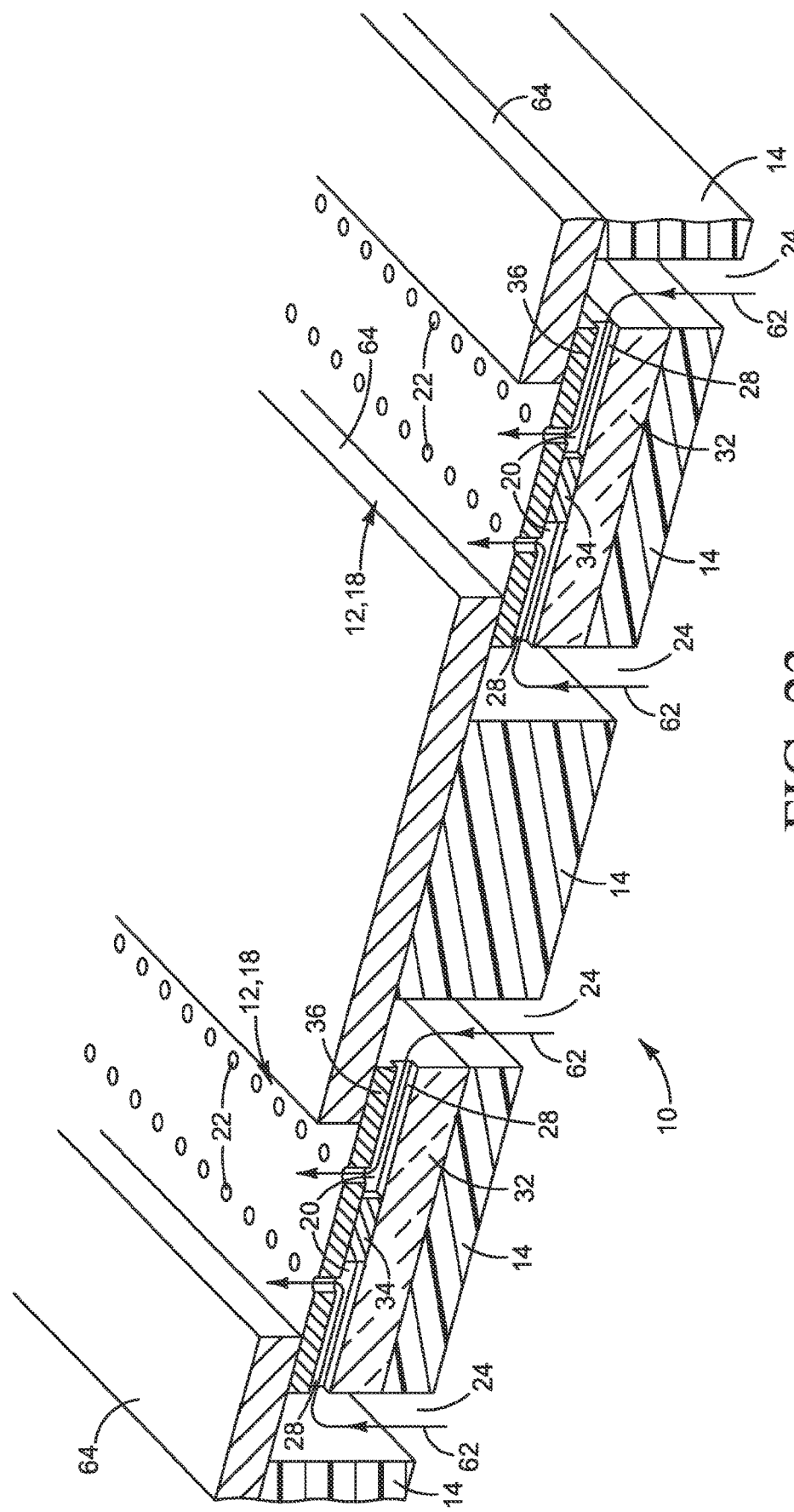
Figure 24:
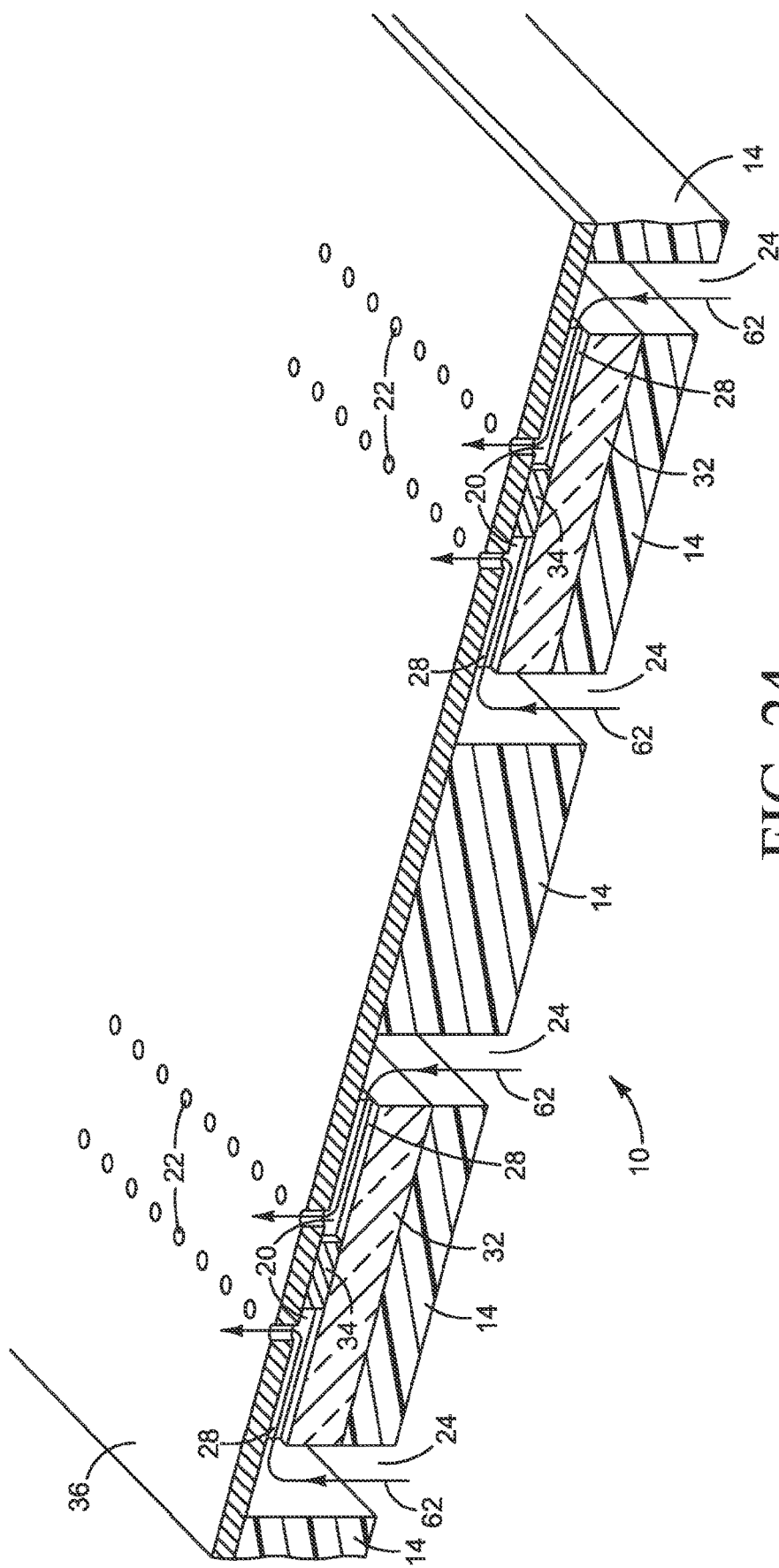

FIGS. 22-24 illustrate other examples of a new printhead structure 10. In these examples, channels 16 are molded in body 14 along each side of printhead die 12. Referring to FIGS. 22-24, printing fluid flows from channels 24 through ports 28 laterally into each ejection chamber 20 directly from channels 24, as indicated by flow arrows 62 in FIGS. 23 and 24. In the example of FIG. 23, a cover 64 is formed over orifice plate 36 to close channels 24. In the example of FIG. 24, orifice plate 36 is applied after molding body 14 to close channels 24.

Figure 25:
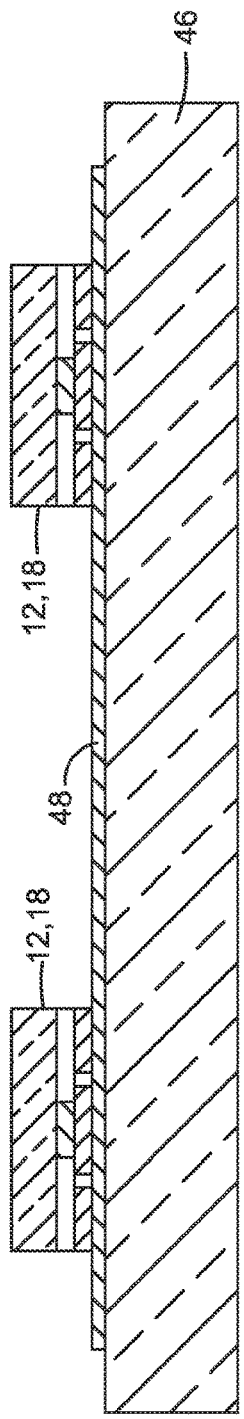
FIGS. 25-27 and 28-30 illustrate example processes for making a printhead flow structure such as those shown in FIGS. 22-24.
Figure 26:
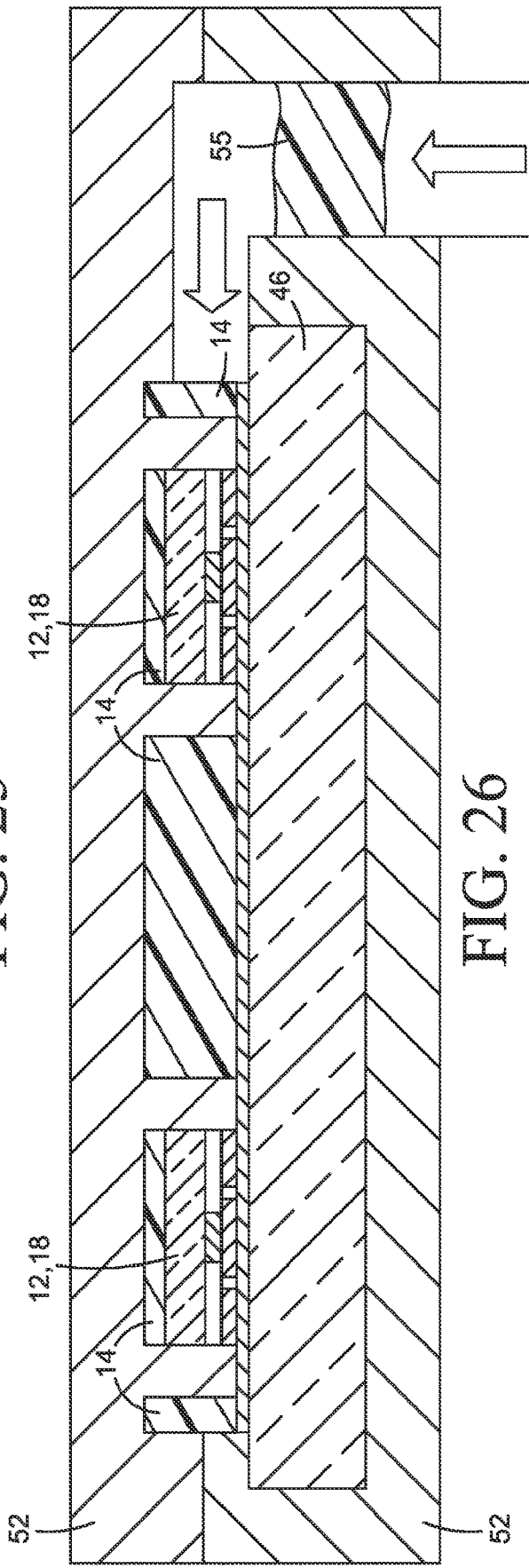
Figure 27:
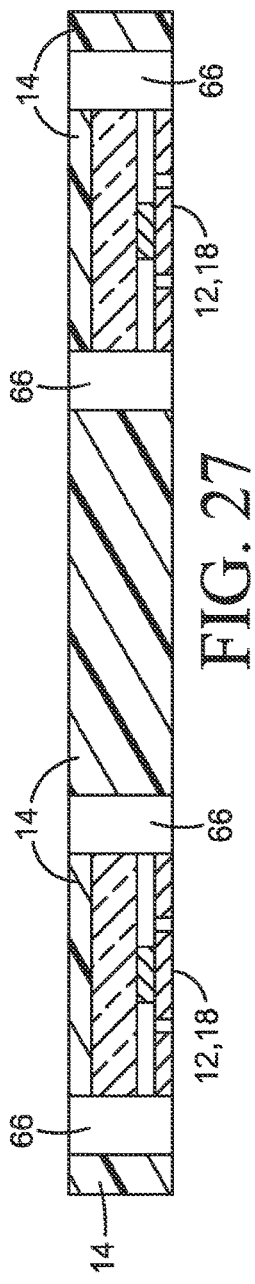

FIGS. 25-27 illustrate one example of a process for making the printhead structure 10 shown in FIG. 23. Referring to FIG. 25, printhead dies 18 are placed orifice side down on a carrier 46 and secured with a thermal release tape 48 or other suitable temporary adhesive. In FIG. 26 a transfer molding tool 52 forms a body 14 around printhead dies 18 and, after molding, printhead structure 10 is released from carrier 46 as shown in FIG. 27. In this example, partially formed channels 66 are molded into body 14. Cover 64 is applied to or formed on the in-process structure of FIG. 27 to complete channels 24, as shown in FIG. 23.

Figure 28:
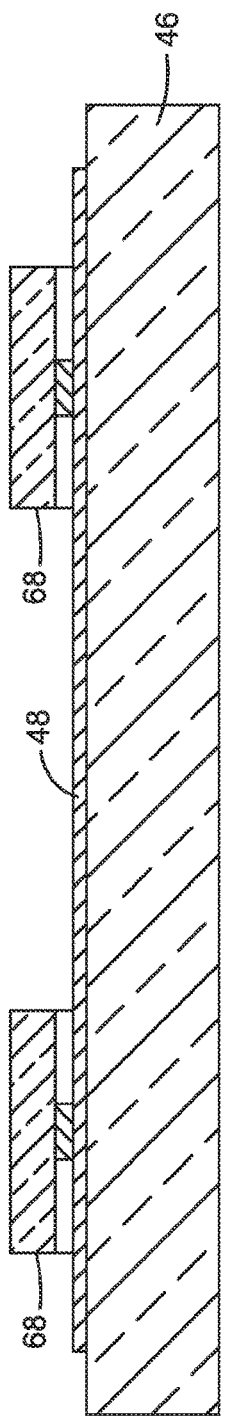
Figure 29:
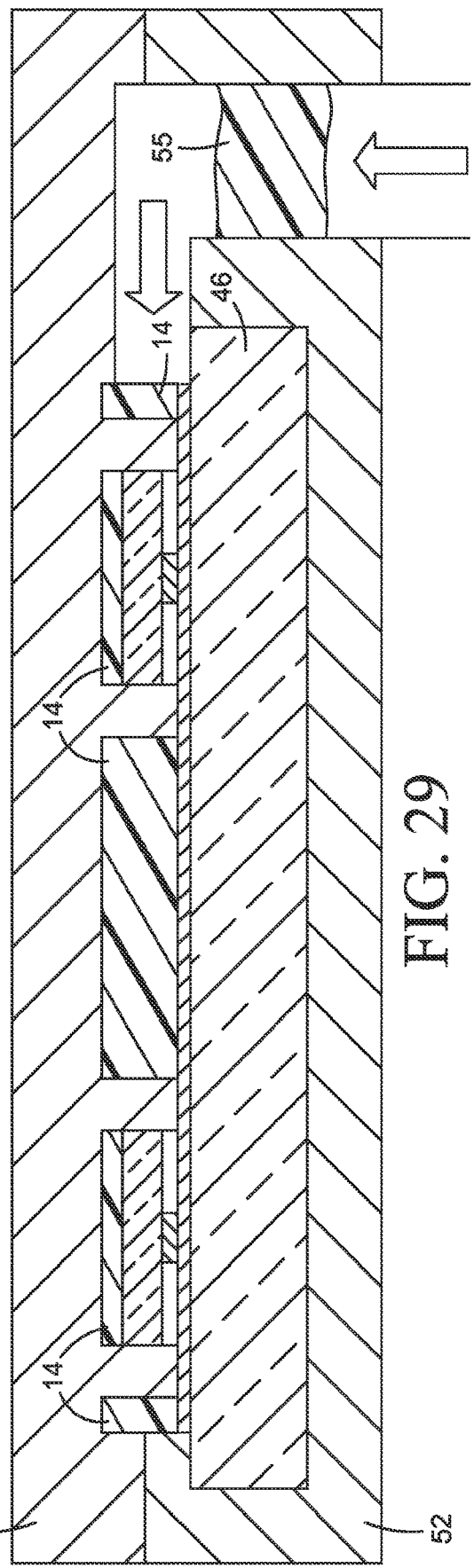
Figure 30:
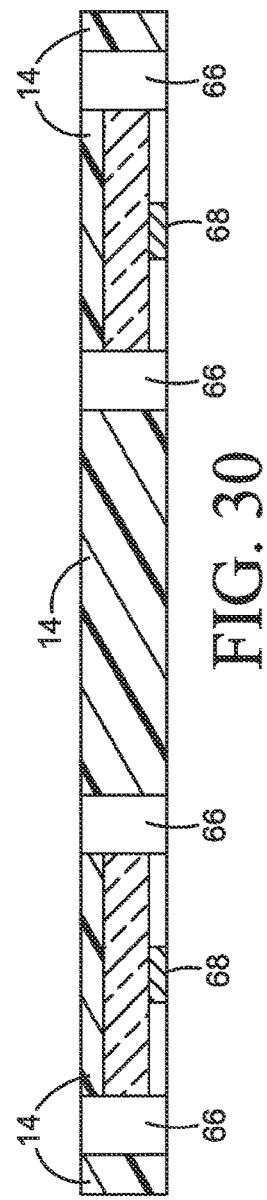

FIGS. 28-30 illustrate one example of a process for making the printhead structure 10 shown in FIG. 24. In this example, and referring to FIG. 28, partially completed printhead dies 68 are placed on carrier 46 and secured with a temporary adhesive 48. In FIG. 29, transfer molding tool 52 forms a body 14 around partial printhead dies 68 with partially formed channels 66 (FIG. 30) molded into body 14. After molding, printhead structure 10 is released from carrier 46, as shown in FIG. 30, and then an orifice plate 36 is applied to or formed on the in-process structure of FIG. 30 to complete channels 24 and dies 18 as shown in FIG. 24.

Molding flow structure 10 helps enable the use of long, narrow and very thin printhead dies 18. For example, it has been shown that a 100 µm thick printhead die 18 that is 25 mm long and 500 µm wide can be molded into a 500 µm thick body 14 to replace a conventional 500 µm thick silicon printhead die. Not only is it cheaper and easier to mold channels 24 into body 14 compared to forming the feed channels in a silicon substrate, but it is also cheaper and easier to form printing fluid ports 28 in a thinner die 12. For example, ports 28 in a 100 µm thick printhead die 12 may be formed by dry etching and other suitable micromachining techniques not practical for thicker substrates. Micromachining a high density array of through ports 28 in a thin silicon, glass or other substrate 32 rather than forming conventional slots leaves a stronger substrate while still providing adequate printing fluid flow. It is expected that current die handling equipment and micro device molding tools and techniques can adapted to mold dies 18 as thin as 50 µm, with a length/width ratio up to 150, and to mold or otherwise form channels 24 as narrow as 30 µm. And, the molding 14 provides an effective but inexpensive structure in which multiple rows of such die slivers can be supported in a single, monolithic body.

As noted at the beginning of this Description, the examples shown in the figures and described above illustrate but do not limit the invention. Other examples are possible. Therefore, the foregoing description should not be construed to limit the scope of the invention, which is defined in the following claims.

What is claimed is:

1. A process for making a print bar, comprising:
arranging multiple printhead die slivers on a carrier in a pattern for a print bar, each die sliver having an inlet through which fluid may enter the die sliver and a front with orifices through which fluid may be dispensed from the die sliver, and the die slivers arranged on the carrier with the front of each die sliver facing the carrier;
molding a body of material around each die sliver without covering the orifices on the front of the die sliver;
forming openings in the body at the inlets;
removing the die slivers from the carrier; and
separating groups of die slivers into print bars;
wherein forming the openings comprises applying a pre-molding form to the die slivers in a pattern defining the openings and then molding the body of material around the die slivers.

2. The process of claim 1, further comprising:
applying a pattern of electrical conductors to the carrier;
connecting an electrical terminal on each die sliver to a conductor; and
molding the body around the conductors simultaneously with molding the body around each die sliver.

3. The process of claim 1, wherein forming the openings comprises molding the openings into the body simultaneously with molding the body around each die sliver.

4. The process of claim 1, wherein molding the body comprises molding a monolithic body of material simultaneously around all of the die slivers.

5. The process of claim 4, wherein molding the body simultaneously around each die sliver comprises transfer molding a monolithic body of material simultaneously around all of the die slivers.

6. The process of claim 1, wherein removing the die slivers is performed after separating groups of die slivers into print bars.

7. The process of claim 1, wherein the pre-molding form is glued to a backside of the die slivers.

8. A process for making a printhead structure, comprising forming fluid flow channels in a body of material surrounding multiple printhead dies such that one or more of the channels contacts a flow passage into each of the dies;
wherein forming the channels in a body surrounding the dies includes applying a pre-molding form part of the body to the dies in a pattern defining the channels and then molding another part of the body around the dies.

9. The process of claim 8, wherein forming the channels in a body surrounding the die includes molding the channels into the body simultaneously with molding the body around the dies.

10. The process of claim 8, wherein forming the channels in a body surrounding the die includes molding partially formed channels in the body simultaneously with molding the body around the dies, wherein the partially formed channels are open along a length thereof, and then covering the partially formed channels by applying a cover to enclose the lengths of the fluid flow channels.

11. The process of claim 10, wherein the printhead dies are partially completed printhead dies and covering the partially formed channels includes covering the partially formed channels with a printhead die orifice plate.

12. A process for making a micro device structure, comprising molding a micro device in a monolithic body of material, the micro device comprising a die having an integrated circuit formed on a substrate within the micro device, and forming a fluid flow passage in the body through which fluid can pass directly to an exterior surface of the micro device.

13. The process of claim 12, wherein the micro device comprises a printhead die sliver.

14. The process of claim 12, wherein the fluid flow channel is formed simultaneously with molding the micro device in the body.

15. The process of claim 12, further comprising using a molding tool having a portion that, when engaged prior to molding, contacts a fluid-input side of the micro device and prevents molding material from entering an area that becomes the fluid flow passage upon removal of the molding tool.

16. The process of claim 12, further comprising attaching a pre-molding form to a fluid-input side of the micro device, the pre-molding form preventing molding material from entering an area that becomes the fluid flow passage through which fluid can pass directly to the micro device.

17. The process of claim 16, further comprising gluing the pre-molding form to the fluid-input side of the micro device.

18. The process of claim 12, wherein:
the micro device structure is a print bar and the micro device is a printhead die sliver, the method further comprising:
molding a micro device in a monolithic body of material comprises arranging multiple printhead die slivers on a carrier in a pattern for the print bar, each die sliver having an inlet through which fluid may enter the die sliver and a front with orifices through which fluid may be dispensed from the die sliver, and the die slivers arranged on the carrier with the front of each die sliver facing the carrier, and molding a body of material around each die sliver without covering the orifices on the front of the die sliver;
forming a fluid flow passage comprises forming openings in the body at the inlets.

19. The process of claim 18, further comprising:
removing the die slivers from the carrier; and
separating groups of die slivers into print bars.

* * * * *